US012218650B2

(12) United States Patent
Yantchev

(10) Patent No.: US 12,218,650 B2
(45) Date of Patent: *Feb. 4, 2025

(54) TRANSVERSELY-EXCITED FILM BULK ACOUSTIC RESONATOR

(71) Applicant: Murata Manufacturing Co., Ltd., Nagaokakyo (JP)

(72) Inventor: Ventsislav Yantchev, Sofia (BG)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/364,911

(22) Filed: Aug. 3, 2023

(65) Prior Publication Data

US 2024/0022233 A1  Jan. 18, 2024

Related U.S. Application Data

(63) Continuation of application No. 17/095,591, filed on Nov. 11, 2020, now Pat. No. 11,870,423, which is a
(Continued)

(51) Int. Cl.
*H03H 9/56* (2006.01)
*H03H 3/02* (2006.01)
(Continued)

(52) U.S. Cl.
CPC .............. *H03H 9/568* (2013.01); *H03H 3/02* (2013.01); *H03H 9/02015* (2013.01);
(Continued)

(58) Field of Classification Search
CPC ............ H03H 9/568; H03H 9/02015; H03H 9/02031; H03H 9/02062; H03H 9/02228;
(Continued)

(56) References Cited

U.S. PATENT DOCUMENTS 5,705,399 A   1/1998  Larue
5,853,601 A  12/1998  Krishaswamy et al.
(Continued)

FOREIGN PATENT DOCUMENTS

CN   201893487 U   7/2011
JP   10-209804 A   8/1998
(Continued)

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.
(Continued)

Primary Examiner — J. San Martin
(74) Attorney, Agent, or Firm — ARENTFOX SCHIFF LLP

(57) ABSTRACT

Acoustic resonator devices and filters are disclosed. An acoustic resonator includes a substrate having a surface and a single-crystal lithium niobate (LN) plate having front and back surfaces, the back surface attached to the surface of the substrate except for a portion of the LN plate forming a diaphragm that spans a cavity in the substrate. An interdigital transducer (IDT) is formed on the front surface of the LN plate such that interleaved fingers of the IDT are disposed on the diaphragm. A half-lambda dielectric layer is formed on one of the front surface and back surface of the diaphragm. Euler angles of the LN plate are [0°, β, 0°], where $20° \leq \beta \leq 25°$.

20 Claims, 15 Drawing Sheets

Related U.S. Application Data continuation-in-part of application No. 16/819,623, filed on Mar. 16, 2020, now Pat. No. 10,868,510, which is a continuation-in-part of application No. 16/689,707, filed on Nov. 20, 2019, now Pat. No. 10,917,070, which is a continuation of application No. 16/230,443, filed on Dec. 21, 2018, now Pat. No. 10,491,192.

(60) Provisional application No. 63/082,317, filed on Sep. 23, 2020, provisional application No. 62/818,571, filed on Mar. 14, 2019, provisional application No. 62/753,815, filed on Oct. 31, 2018, provisional application No. 62/748,883, filed on Oct. 22, 2018, provisional application No. 62/741,702, filed on Oct. 5, 2018, provisional application No. 62/701,363, filed on Jul. 20, 2018, provisional application No. 62/685,825, filed on Jun. 15, 2018.

(51) Int. Cl.
*H03H 9/02* (2006.01)
*H03H 9/13* (2006.01)
*H03H 9/17* (2006.01)
*H10N 30/87* (2023.01)

(52) U.S. Cl.
CPC .... *H03H 9/02031* (2013.01); *H03H 9/02062* (2013.01); *H03H 9/02228* (2013.01); *H03H 9/132* (2013.01); *H03H 9/174* (2013.01); *H03H 9/176* (2013.01); *H03H 9/562* (2013.01); *H03H 9/564* (2013.01); *H03H 2003/023* (2013.01); *H03H 9/02039* (2013.01); *H10N 30/877* (2023.02)

(58) Field of Classification Search
CPC ........ H03H 9/132; H03H 9/174; H03H 9/176; H03H 9/562; H03H 9/564; H03H 9/02039; H03H 2003/023; H03H 3/02
See application file for complete search history.

(56) References Cited

U.S. PATENT DOCUMENTS

| | | | |
|---|---|---|---|
| 5,923,231 A * | 7/1999 | Ohkubo | H03H 9/25 29/25.35 |
| 6,540,827 B1 | 4/2003 | Levy et al. | |
| 6,707,229 B1 | 3/2004 | Martin | |
| 7,463,118 B2 | 12/2008 | Jacobsen | |
| 7,535,152 B2 | 5/2009 | Ogami et al. | |
| 7,684,109 B2 | 3/2010 | Godshalk et al. | |
| 7,802,466 B2 | 9/2010 | Whalen et al. | |
| 7,868,519 B2 | 1/2011 | Umeda | |
| 8,278,802 B1 | 10/2012 | Lee et al. | |
| 8,344,815 B2 | 1/2013 | Yamanaka | |
| 8,829,766 B2 | 9/2014 | Milyutin et al. | |
| 8,932,686 B2 | 1/2015 | Hayakawa et al. | |
| 9,130,145 B2 | 9/2015 | Martin et al. | |
| 9,219,466 B2 | 12/2015 | Meltaus et al. | |
| 9,276,557 B1 | 3/2016 | Nordquist et al. | |
| 9,369,105 B1 | 6/2016 | Li | |
| 9,425,765 B2 | 8/2016 | Rinaldi | |
| 9,525,398 B1 | 12/2016 | Olsson | |
| 9,748,923 B2 | 8/2017 | Kando et al. | |
| 9,780,759 B2 | 10/2017 | Kimura et al. | |
| 10,200,013 B2 | 2/2019 | Bower et al. | |
| 10,491,192 B1 | 11/2019 | Plesski et al. | |
| 10,601,392 B2 | 3/2020 | Plesski et al. | |
| 10,637,438 B2 | 4/2020 | Garcia et al. | |
| 10,756,697 B2 | 8/2020 | Plesski et al. | |
| 10,790,802 B2 * | 9/2020 | Yantchev | H03H 9/02062 |
| 10,797,675 B2 | 10/2020 | Plesski | |
| 10,826,462 B2 | 11/2020 | Plesski et al. | |
| 11,870,423 B2 * | 1/2024 | Yantchev | H03H 9/564 |
| 2002/0079986 A1 | 6/2002 | Ruby et al. | |
| 2002/0158714 A1 | 10/2002 | Kaitila et al. | |
| 2003/0199105 A1 | 10/2003 | Kub et al. | |
| 2004/0090145 A1 | 5/2004 | Bauer et al. | |
| 2004/0261250 A1 | 12/2004 | Kadota et al. | |
| 2006/0125489 A1 | 6/2006 | Feucht et al. | |
| 2006/0222568 A1 | 10/2006 | Wang et al. | |
| 2007/0170565 A1 | 7/2007 | Hong et al. | |
| 2007/0194863 A1 | 8/2007 | Shibata et al. | |
| 2010/0064492 A1 | 3/2010 | Tanaka | |
| 2010/0123367 A1 | 5/2010 | Tai et al. | |
| 2010/0212127 A1 | 8/2010 | Heinze et al. | |
| 2010/0301703 A1 | 12/2010 | Chen et al. | |
| 2011/0109196 A1 | 5/2011 | Goto | |
| 2011/0278993 A1 | 11/2011 | Iwamoto | |
| 2012/0161577 A1 * | 6/2012 | Abbott | H03H 9/02724 310/313 C |
| 2013/0015353 A1 | 1/2013 | Tai et al. | |
| 2013/0234805 A1 | 9/2013 | Takahashi | |
| 2013/0321100 A1 | 12/2013 | Wang | |
| 2014/0001919 A1 | 1/2014 | Komatsu | |
| 2014/0009032 A1 | 1/2014 | Takahashi et al. | |
| 2014/0113571 A1 | 4/2014 | Fujiwara | |
| 2014/0145556 A1 | 5/2014 | Kadota | |
| 2014/0151151 A1 | 6/2014 | Reinhardt | |
| 2014/0152145 A1 | 6/2014 | Kando et al. | |
| 2014/0173862 A1 | 6/2014 | Kando et al. | |
| 2014/0218129 A1 | 8/2014 | Fujiwara | |
| 2014/0225684 A1 | 8/2014 | Kando et al. | |
| 2015/0319537 A1 | 11/2015 | Perois et al. | |
| 2015/0333730 A1 | 11/2015 | Meltaus | |
| 2016/0028367 A1 | 1/2016 | Shealy | |
| 2016/0182009 A1 | 6/2016 | Bhattacharjee | |
| 2017/0063332 A1 | 3/2017 | Gilbert et al. | |
| 2017/0170808 A1 | 6/2017 | Iwaki et al. | |
| 2017/0179928 A1 | 6/2017 | Raihn et al. | |
| 2017/0214387 A1 | 7/2017 | Burak et al. | |
| 2017/0222622 A1 | 8/2017 | Solal et al. | |
| 2017/0324394 A1 | 11/2017 | Ebner et al. | |
| 2017/0370791 A1 | 12/2017 | Nakamura et al. | |
| 2018/0123016 A1 | 5/2018 | Gong et al. | |
| 2018/0152169 A1 | 5/2018 | Goto et al. | |
| 2018/0191322 A1 | 7/2018 | Chang et al. | |
| 2019/0068164 A1 | 2/2019 | Houlden et al. | |
| 2019/0131953 A1 | 5/2019 | Gong | |
| 2019/0181833 A1 | 6/2019 | Nosaka | |
| 2019/0273480 A1 | 9/2019 | Lin | |
| 2019/0273481 A1 | 9/2019 | Michigami | |
| 2020/0036357 A1 * | 1/2020 | Mimura | H03H 7/0161 |
| 2020/0304091 A1 | 9/2020 | Yantchev | |
| 2020/0336130 A1 | 10/2020 | Turner | |
| 2020/0373907 A1 | 11/2020 | Garcia | |
| 2021/0006228 A1 | 1/2021 | Garcia | |
| 2021/0013859 A1 | 1/2021 | Turner et al. | |
| 2021/0013868 A1 | 1/2021 | Plesski | |
| 2021/0083652 A1 * | 3/2021 | Yantchev | H03H 9/02015 |
| 2021/0126619 A1 | 4/2021 | Wang et al. | |
| 2021/0273631 A1 * | 9/2021 | Jachowski | H03H 9/132 |
| 2022/0103160 A1 | 3/2022 | Jachowski | |
| 2022/0231661 A1 | 7/2022 | McHugh | |
| 2023/0223923 A1 * | 7/2023 | Inoue | H03H 9/02228 310/348 |
| 2023/0275560 A1 * | 8/2023 | Kubo | H03H 9/02031 |
| 2024/0154596 A1 * | 5/2024 | Daimon | H03H 9/132 |

FOREIGN PATENT DOCUMENTS

| | | |
|---|---|---|
| JP | 2002300003 A | 10/2002 |
| JP | 2007251910 A | 9/2007 |
| JP | 2010103803 A | 5/2010 |
| JP | 2015054986 A | 3/2015 |
| JP | 2016-001923 A | 7/2016 |
| JP | 2017220910 A | 12/2017 |
| JP | 2018166259 A | 10/2018 |
| JP | 2018207144 A | 12/2018 |
| JP | 2019186655 A | 10/2019 |
| JP | 2020088459 A | 6/2020 |
| JP | 2020113939 A | 7/2020 |

(56) References Cited

FOREIGN PATENT DOCUMENTS

| WO | 2015098694 | A1 | 7/2015 |
| WO | 2016017104 |  | 2/2016 |
| WO | 2016052129 | A1 | 4/2016 |
| WO | 2018003273 | A1 | 1/2018 |
| WO | 2018079522 | A1 | 5/2018 |
| WO | 2018163860 | A1 | 9/2018 |
| WO | 2019138810 | A1 | 7/2019 |
| WO | 2019241174 | A1 | 12/2019 |
| WO | 2020092414 | A2 | 5/2020 |
| WO | 2020175234 | A1 | 9/2020 |
| WO | 2021060523 | A1 | 4/2021 |
| WO | 2023002858 | A1 | 1/2023 |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHZ Lithium Niobate MEMS Resonators With High Fom Of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A.. (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Y-cut X- propagation LiNbO3 plates." Electron. Comm. Jpn. Pt. I, 69, No. 4 (1986): 47-55. doi:10.1002/ecja.4410690406.

Naumenko et al., "Optimal orientations of Lithium Niobate for resonator SAW filters", 2003 IEEE Ultrasonics SYMPOSIUM-pp. 2110-2113. (Year: 2003).

Webster Dictionary "Meaning of "diaphragm" Merriam Webster since 1828.

Safari et al. "Piezoelectric for Transducer Applications" published by Elsevier Science Ltd., pp. 4 (Year: 2000).

Moussa et al. Review on Triggered Liposomal Drug Delivery with a Focus on Ultrasound 2015, Bentham Science Publishers, pp. 16 (Year 2005).

"Acoustic Properties of Solids" ONDA Corporation, 592 Weddell Drive, Sunnyvale, CA 94089, Apr. 11, 2003, pp. 5 (Year 2003).

Bahreynl, B., "Fabrication and Design of Resonant Microdevices" Andrew William, Inc. 2018, NY (Year: 2008).

Material Properties of Tibtech Innovations, © 2018 TIBTECH Innovations (Year 2018).

Bousquet, Marie e al. "Single-mode high frequency LiNbO3 Film Bulk Acoustic Resonator, " 2019 IEEE International Ultrasonics Symposium (IUS), Glasgow, Scotland, Oct. 6-9, 2019, pp. 84-87.

Wikipedia contributors, "Quartz crystal microbalance," Wikipedia, The Free Encyclopedia, https://en.wikipedia.org/w/index.php?title=Quartz_crystal_microbalance&oldid=1009990186 (accessed Apr. 9, 2021).

Yantchev, Ventsislav & Katardjiev, Ilia. (2013). Thin film Lamb wave resonators in frequency control and sensing applications: A review. Journal of Micromechanics and Microengineering. 23. 043001. 10.1088/0960-1317/23/4/043001.

Wei Pang et al. "Analytical and experimental study on the second harmonic mode response of a bulk acoustic wave resonator" 2010 J. Micromech. Microeng. 20 115015; doi: 10.1088/0960-1317/20/11/115015.

Durmus et al. "Acoustic-Based Biosensors" Encyclopedia of Microfluidics and Nanofluidics. DOI 10.1007/978-3-642-27758-0_10-2 Springer Science+Business Media New York 2014.

USPTO/ISA, International Search Report and Written Opinion for PCT Application No. PCT/US2023/017732 dated Jul. 27, 2023.

USPTO/ISA, International Search Report and Written Opinion for PCT Application No. PCT/US2022/082421 dated May 3, 2023.

USPTO/ISA, International Search Report and Written Opinion for PCT Application No. PCT/US2022/081095 dated May 30, 2023.

USPTO/ISA, International Search Report and Written Opinion for PCT Application No. PCT/US2022/079236 dated Mar. 10, 2023.

USPTO/ISA, International Search Report and Written Opinion for PCT Application No. PCT/US2022/081068 dated Apr. 18, 2023.

USPTO/ISA, International Search Report and Written Opinion for PCT Application No. PCT/US2022/080246 dated Mar. 30, 2023.

* cited by examiner

TRANSVERSELY-EXCITED FILM BULK ACOUSTIC RESONATOR

CROSS REFERENCE TO RELATED APPLICATIONS

This patent application is a continuation of U.S. patent application Ser. No. 17/095,591, filed Nov. 11, 2020, which claims priority from U.S. provisional patent application 63/082,317, filed Sep. 23, 2020, entitled WIDE BANDWIDTH TEMPERATURE COMPENSATED XBAR. U.S. patent application Ser. No. 17/095,591 is a continuation-in-part of application Ser. No. 16/819,623, filed Mar. 16, 2020, entitled TRANSVERSELY EXCITED FILM BULK ACOUSTIC RESONATOR WITH HALF-LAMBDA DIELECTRIC LAYER, which claims priority from U.S. provisional patent application 62/818,571, filed Mar. 14, 2019, entitled XBAR WITH HALF-LAMBDA OVERLAYER, and is a continuation-in-part of application Ser. No. 16/689,707, filed Nov. 20, 2019, entitled BANDPASS FILTER WITH FREQUENCY SEPARATION BETWEEN SHUNT AND SERIES RESONATORS SET BY DIELECTRIC LAYER THICKNESS, which is a continuation of application Ser. No. 16/230,443, filed Dec. 21, 2018, entitled TRANSVERSELY-EXCITED FILM BULK ACOUSTIC RESONATOR, now U.S. Pat. No. 10,491,192, which claims priority from the following provisional patent applications: U.S. Application No. 62/685,825, filed Jun. 15, 2018, entitled SHEAR-MODE FBAR (XBAR); U.S. Application No. 62/701,363, filed Jul. 20, 2018, entitled SHEAR-MODE FBAR (XBAR); U.S. Application No. 62/741,702, filed Oct. 5, 2018, entitled 5 GHZ LATERALLY-EXCITED BULK WAVE RESONATOR (XBAR); U.S. Application No. 62/748,883, filed Oct. 22, 2018, entitled SHEAR-MODE FILM BULK ACOUSTIC RESONATOR; and U.S. Application No. 62/753,815, filed Oct. 31, 2018, entitled LITHIUM TANTALATE SHEAR-MODE FILM BULK ACOUSTIC RESONATOR. All of these applications are incorporated herein by reference.

TECHNICAL FIELD

This disclosure relates to radio frequency filters using acoustic wave resonators, and specifically to filters for use in communications equipment.

BACKGROUND

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

The desire for wider communication channel bandwidths will inevitably lead to the use of higher frequency communications bands. The current LTE™ (Long Term Evolution) specification defines frequency bands from 3.3 GHz to 5.9 GHz. Some of these bands are not presently used. Future proposals for wireless communications include millimeter wave communication bands with frequencies up to 28 GHz.

High performance RF filters for present communication systems commonly incorporate acoustic wave resonators including surface acoustic wave (SAW) resonators, bulk acoustic wave BAW) resonators, film bulk acoustic wave resonators (FBAR), and other types of acoustic resonators. However, these existing technologies are not well-suited for use at the higher frequencies proposed for future communications networks.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
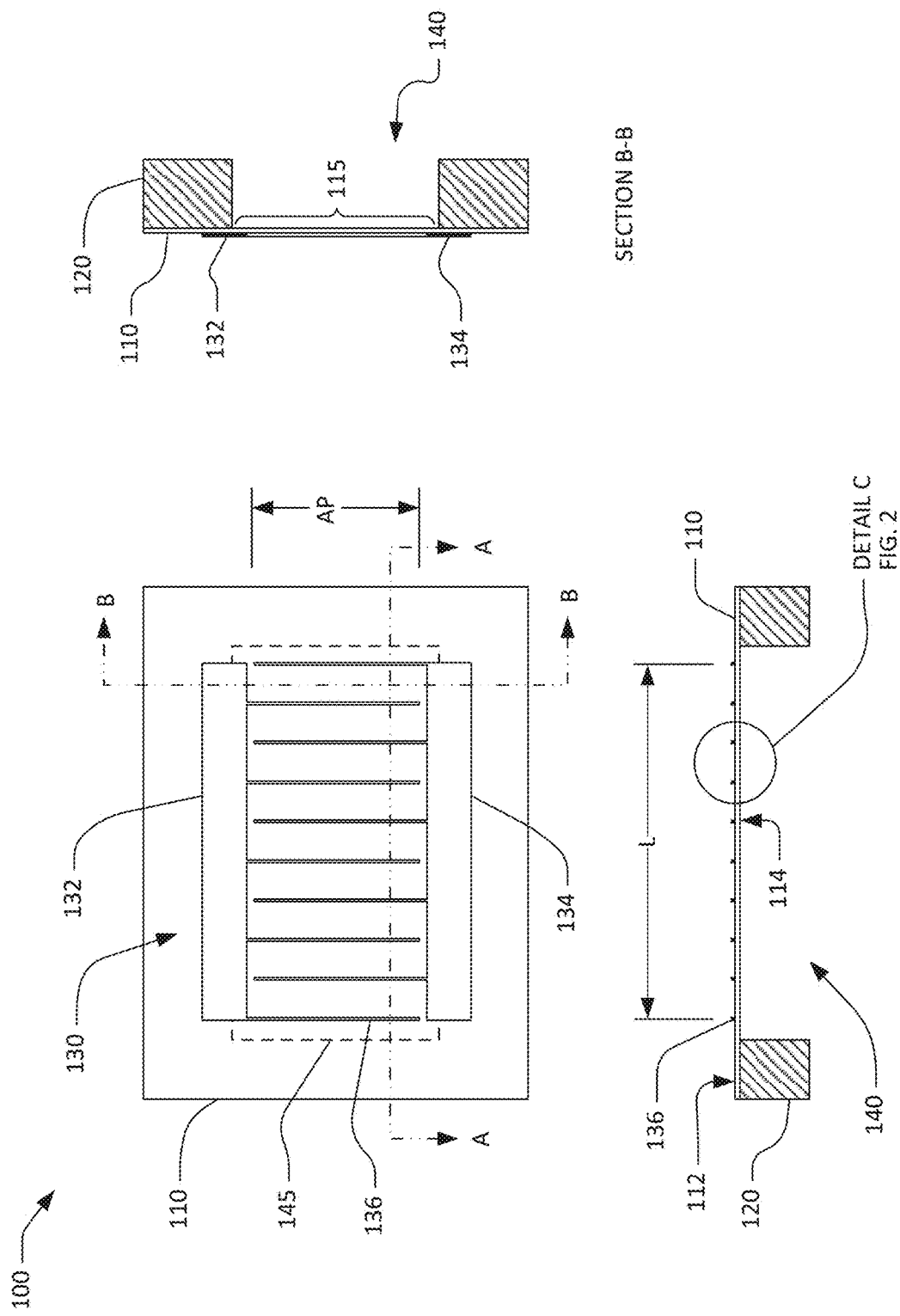
FIG. 1 includes a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100 as described in U.S. Pat. No. 10,491,192. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the front and back surfaces 112, 114. However, XBARs may be fabricated on piezoelectric plates with other crystallographic orientations.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item".

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers.

"Cavity" has its conventional meaning of "an empty space within a solid body." The cavity 140 may be a hole completely through the substrate 120 (as shown in Section A-A and Section B-B) or a recess in the substrate 120. The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. The primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the portion 115 of the piezoelectric plate that spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
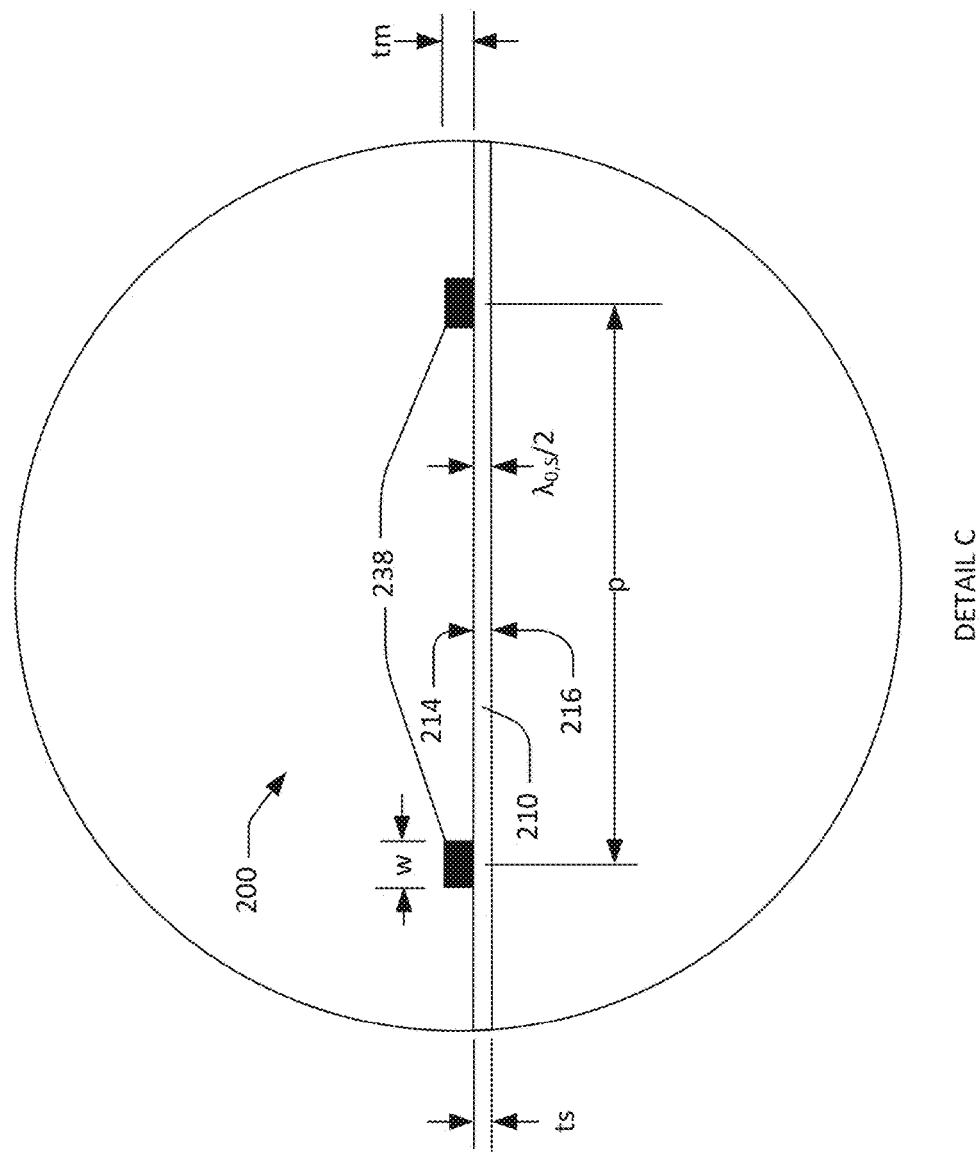
FIG. 2 is an expanded schematic cross-sectional view of a portion of the XBAR of FIG. 1.

FIG. 2 shows a detailed schematic cross-sectional view of an XBAR 200 which may be the XBAR 100 of FIG. 1. The piezoelectric plate 210 is a single-crystal layer of piezoelectrical material having a front surface 214 and a back surface 216. The thickness ts between the front surface 214 and the back surface 216 may be, for example, 100 nm to 1500 nm. When used in filters for 5G NR (fifth generation new radio) and Wi-Fi™ bands from 3.3 GHZ to 6 GHz, the thickness ts may be, for example, 280 nm to 550 nm.

The IDT fingers 238 may be aluminum, a substantially aluminum alloy, copper, a substantially copper alloy, tungsten, molybdenum, beryllium, gold, or some other conductive material. Thin (relative to the total thickness of the conductors) layers of other metals, such as chromium or titanium, may be formed under and/or over the fingers to improve adhesion between the fingers and the piezoelectric plate 210 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness ts of the piezoelectric plate 210. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

A shear bulk acoustic wave (BAW) propagating normal to the surfaces of a piezoelectric plate will reflect from the surfaces and resonate, or form a standing wave, when the thickness ts of the piezoelectric plate is an integer multiple of one-half of the wavelength λ, of the acoustic wave. The longest wavelength/lowest frequency where such a resonance occurs is the shear BAW fundamental resonance at a frequency $f_0$ and a wavelength $\lambda_{0,s}$ equal to twice the thickness is of the piezoelectric plate. The terminology "$\lambda_{0,s}$" means the wavelength, in the piezoelectric plate, of the shear BAW fundamental (0 order) resonance of the piezoelectric plate. The wavelength of the same acoustic wave (i.e. a shear BAW propagating in the same direction with the same frequency) may be different in other materials. The frequency $f_0$ may be determined by dividing the velocity of the shear BAW in the piezoelectric plate by the wavelength $\lambda_{0,s}$. The shear BAW fundamental resonance of the piezoelectric plate is not the same as the resonance of the XBAR device 200, which is influenced by the IDT structure.

Figure 3:
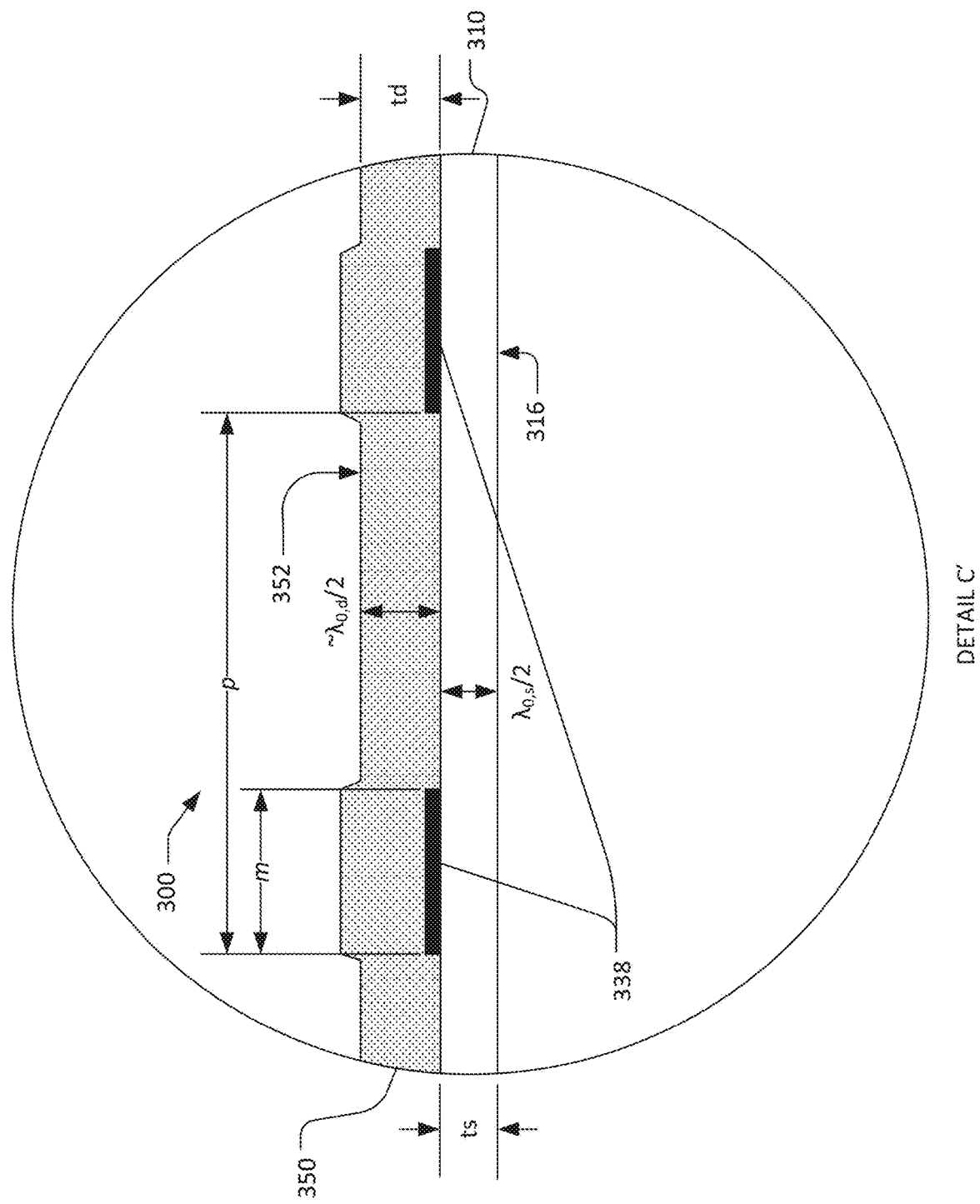
FIG. 3 is an expanded schematic cross-sectional view of a portion of an improved XBAR including a "half-lambda" dielectric layer.

FIG. 3 shows a detailed schematic cross-sectional view of an XBAR that incorporates a "half-lambda" dielectric layer. FIG. 3 specifically shows an XBAR 300 with a thick dielectric layer 350 on the front side (i.e. the side facing away from the substrate; the upper side as shown in FIG. 3) of a piezoelectric plate 310. A comparable dielectric layer on the back side 316 of the piezoelectric plate 310 could be used instead of the dielectric layer 350. On a larger scale, the XBAR 300 with the thick dielectric layer 350 is similar to the XBAR 100 of FIG. 1. FIG. 3 also shows two IDT fingers 338 as previously described. Dimension p is the center-to-center spacing or "pitch" of the IDT fingers, and dimension w is the width or "mark" of the IDT fingers.

The piezoelectric plate 310 is a thin single-crystal layer of a piezoelectric material such as lithium niobate or lithium tantalate. The piezoelectric plate 310 is cut such that the orientation of the X, Y, and Z crystalline axes with respect to the front and back surfaces 314, 316 is known and consistent. The thickness ts of the piezoelectric plate 310 may be, for example, 100 nm to 1500 nm.

The dielectric layer 350 may be nearly any dielectric material such as $SiO_2$, $Si_3N_4$, $Al_2O_3$, AlN. and other dielectric materials. As will be discussed, particular benefits may accrue when the dielectric material is or contains AlN and when the dielectric material is $SiO_2$.

The thickness ts of the piezoelectric plate 310 and the thickness td of the dielectric layer 350 are configured such that a shear BAW propagating normal to the surfaces 316 and 352 forms a full-cycle standing wave between the surfaces 316 and 352 at a predetermined frequency, which may be slightly less than the desired resonance frequency of the XBAR device 300. In other words, the shear BAW second overtone resonance occurs at the predetermined frequency. By definition, the thickness ts of the piezoelectric plate is one-half of $\lambda_{0,s}$, which, as previously described, is the wavelength of the shear BAW fundamental resonance of the piezoelectric plate 310 in the absence of the dielectric layer 350. Nominally the thickness td of the dielectric layer 350 is one-half of $\lambda_{0,d}$, where $\lambda_{0,d}$ is the wavelength of the same bulk BAW in the dielectric layer 350. In this case, each of the piezoelectric plate 310 and the dielectric layer 350 will contain a half cycle standing wave at the frequency $f_0$, which is now the frequency of the second overtone resonance. $\lambda_{0,d}$ is equal to $\lambda_{0,s}$, times the ratio of the velocity of the shear acoustic wave in the dielectric layer 350 to the velocity of the shear acoustic wave in the piezoelectric plate 310. For a relatively slow dielectric material, such as $SiO_2$, $\lambda_{0,d}$ may be equal to or slightly greater than $\lambda_{0,s}$. In this case, the thickness td of the dielectric layer 350 may be equal to or slightly greater than ts. For a relatively fast dielectric material, such as $Si_3N_4$ or AlN, $\lambda_{0,d}$ may be substantially greater than $\lambda_{0,s}$. In this case, the thickness td of the dielectric layer 350 will be proportionally greater than ts.

While the dielectric layer 350 is referred to herein as a "half-lambda" dielectric layer, the thickness td of the dielectric layer need not be exactly $\lambda_{0,d}/2$. The thickness td may differ from $\lambda_{0,d}/2$ so long as the combined thicknesses of the piezoelectric plate 310 and the dielectric layer 350 are such that the second overtone resonance of the bulk shear wave occurs at the predetermined frequency. Simulation results, some of which will be discussed subsequently, show that dielectric layer thickness with a range defined by $$0.85\lambda_{0,d} \leq 2td \leq 1.15\lambda_{0,d} \tag{1}$$

results in XBARs with low spurious modes and consistent electromechanical coupling. Values of td outside of this range result in reduced electromechanical coupling and increased spurious modes. Varying td within this range allows tuning the resonant frequency of an XBAR by about 10%, which is sufficient to establish the necessary frequency offset between shunt and series resonators for many filter applications.

In FIG. 3, the dielectric layer 350 is shown deposited over and between the IDT fingers 338. In other embodiments, a half-lambda dielectric layer may be formed only between the IDT fingers. The half-lambda dielectric layer 350 may be a single layer or two or more layers of different dielectric materials having similar acoustic impedances.

A primary benefit of incorporating the half-lambda dielectric layer 350 into the XBAR 300 is the increased thickness of the diaphragm. Depending on the materials used in the half-lambda dielectric layer 350, the thickness of the diaphragm of the XBAR 300 may be two to three times the thickness of the diaphragm 115 of the XBAR 100 of FIG. 1. A thicker diaphragm is stiffer and less likely to bow or distort with changes in temperature.

The thicker diaphragm of the XBAR 300 will also have higher thermal conductivity, particularly if the half-lambda dielectric layer 350 is or includes a high thermal conductivity dielectric material such as aluminum nitride. Higher thermal conductivity results in more efficient removal of heat from the diaphragm, which may allow the use of a smaller resonator area for a given heat load or power dissipation.

The XBAR 300 will also have higher capacitance per unit area compared with the XBAR 100 of FIG. 1 (for the same IDT pitch). Resonator capacitance is a circuit design issue. In particular, RF filters using acoustic resonators are typically subject to a requirement that the input and output impedances of the filter match a defined value (commonly 50 ohms). This requirement dictates minimum capacitance values for some or all of the resonators in a filter. The higher capacitance per unit area of the XBAR 300 with a half-lambda dielectric layer allows the use of a smaller resonator area for any required capacitance value.

An XBAR with a half-lambda dielectric layer on the back side of the piezoelectric plate 310 (not shown) will have improved stiffness and thermal conductivity, but only slightly increased capacitance per unit area.

Figure 4:
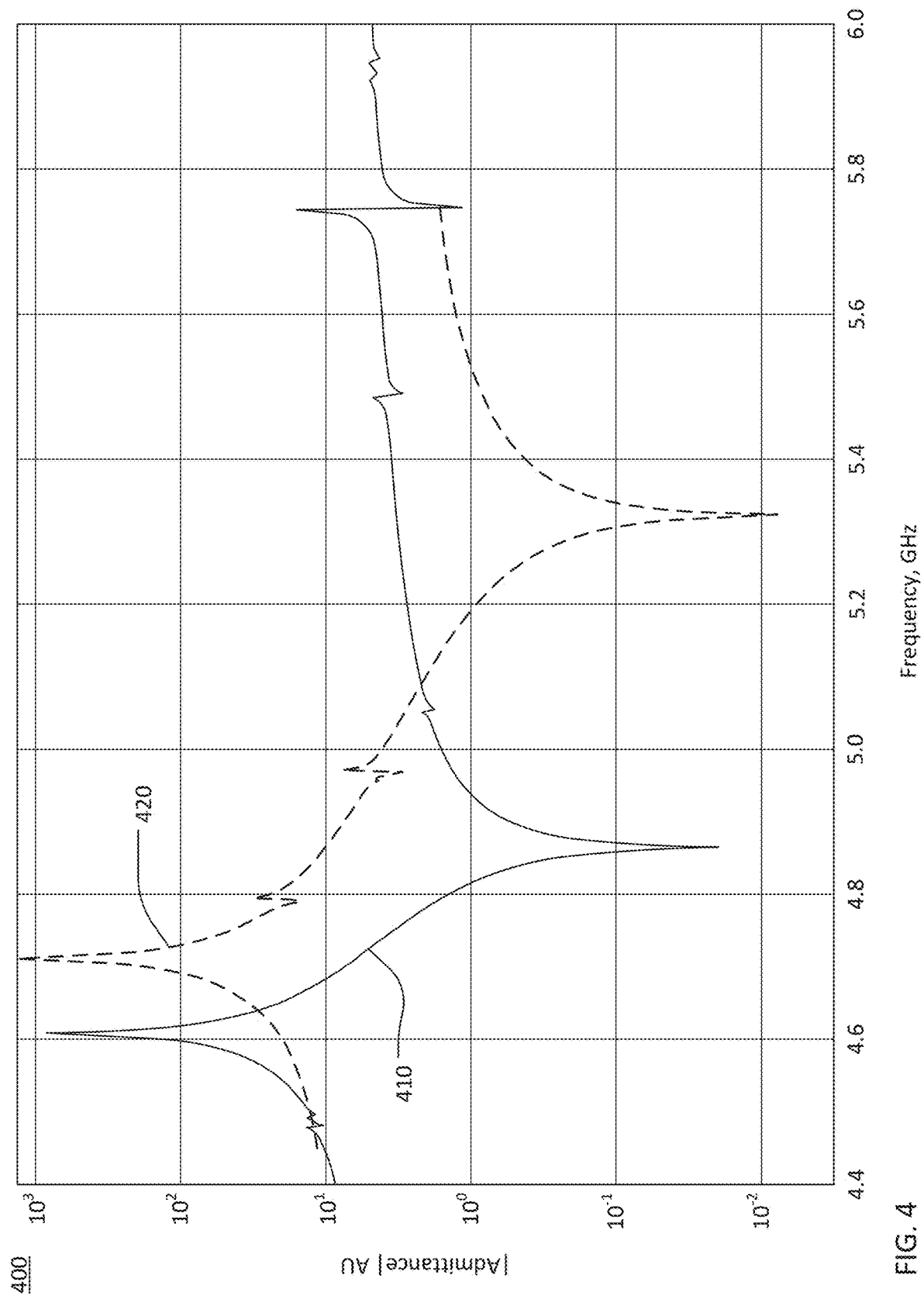
FIG. 4 is a chart comparing the admittances of an XBAR with a half-lambda dielectric layer and a conventional XBAR.
Figure 6:
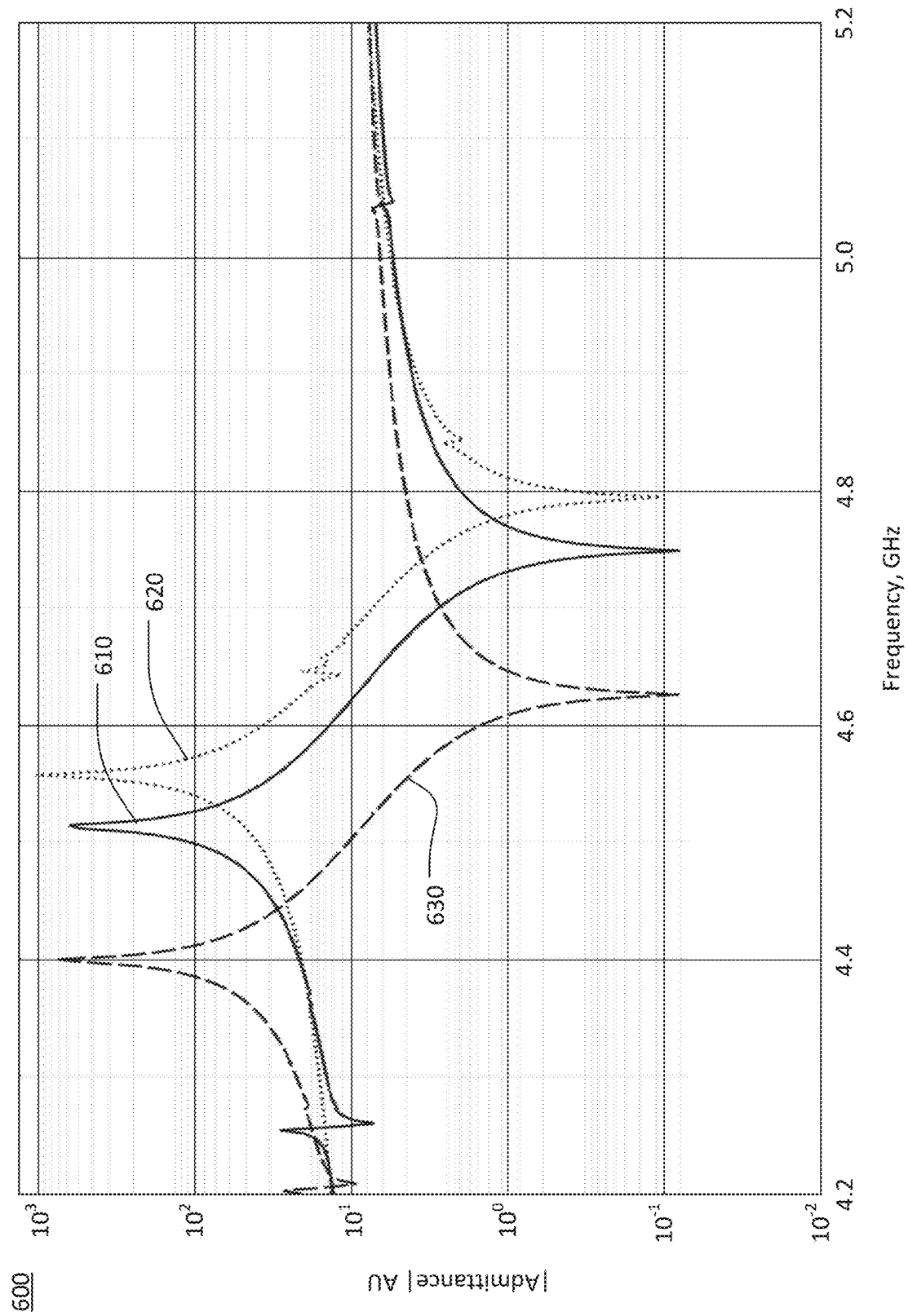
FIG. 6 is a chart comparing the admittances of three XBARs with half-lambda AN layers.
Figure 7:
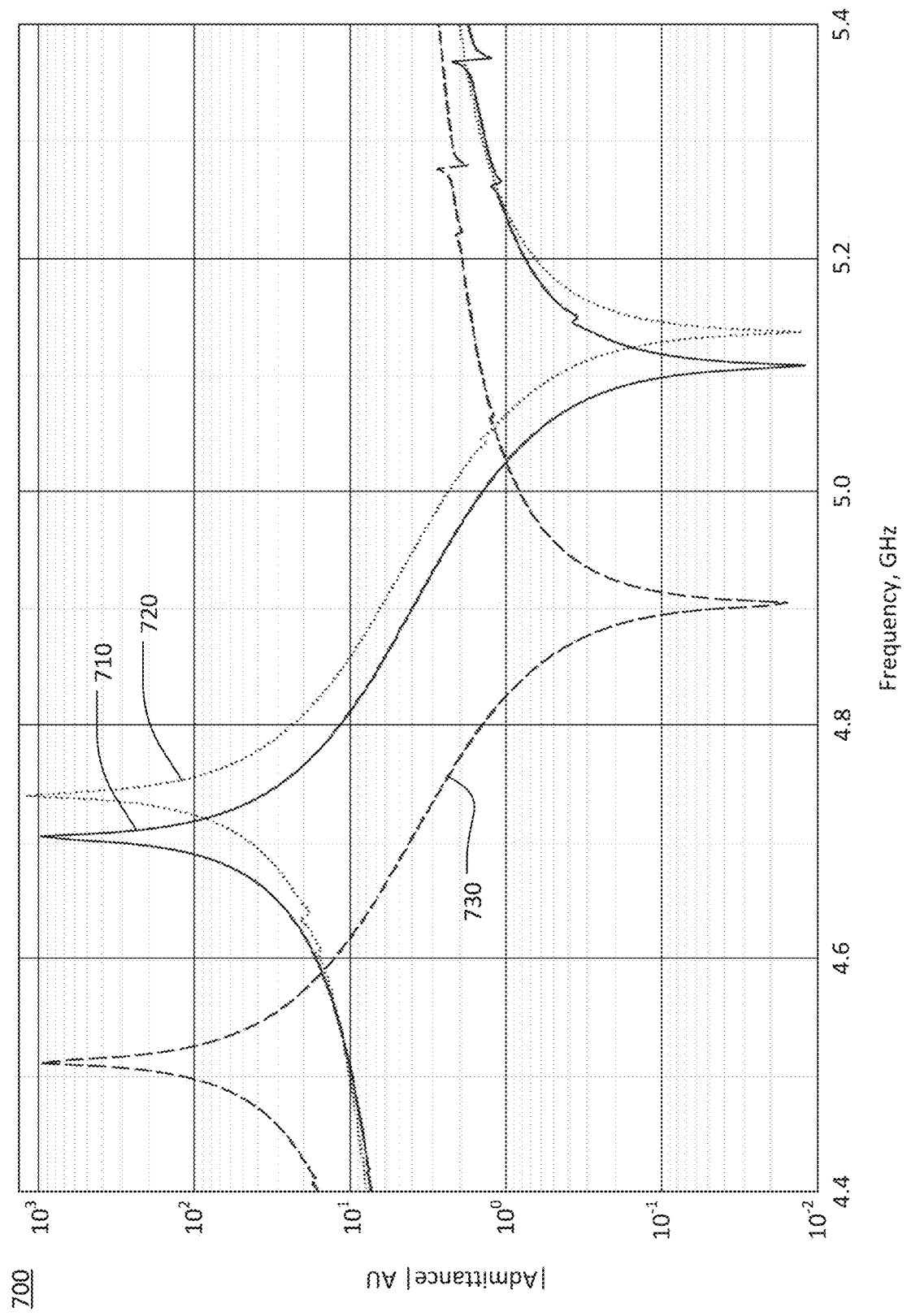
FIG. 7 is a chart comparing the admittances of three XBARs with half-lambda $SiO_2$ layers.

FIG. 4 is a chart 400 comparing the admittance of an XBAR with a half-lambda dielectric layer and a conventional XBAR. The data shown in FIG. 4 and following FIG. 6 and FIG. 7 are results of simulation of the XBAR devices using a finite element method. The solid line 410 is a plot of the magnitude of admittance as a function of frequency for an XBAR including a half-lambda dielectric layer. The piezoelectric plate is lithium niobate 400 nm thick. The IDT is aluminum 100 nm thick. The pitch and mark of the IDT fingers are 4.25 µm and 1.275 µm, respectively. The half-lambda dielectric layer consists of a layer of $Si_3N_4$ 350 nm thick and a layer of AlN 350 nm thick. The resonance frequency is 4.607 GHz and the anti-resonance frequency is 4.862 GHz. The different between the anti-resonance and resonance frequencies is 255 MHz, or about 5.4% of the average of the resonance and anti-resonance frequencies.

The dashed line 420 is a plot of the magnitude of admittance as a function of frequency for a conventional XBAR. The piezoelectric plate is lithium niobate 400 nm thick. The IDT is aluminum 100 nm thick. The pitch and mark of the IDT fingers are 3.7 µm and respectively. The resonance frequency is 4.71 GHz and the anti-resonance frequency is 5.32 GHz. The different between the anti-resonance and resonance frequencies is 610 MHz, or about 12.2% of the average of the resonance and anti-resonance frequencies. The admittance of the conventional XBAR (dashed line 420) exhibits some spurious modes between the resonance and anti-resonance frequencies that are not present in the admittance of the XBAR with the half-lambda dielectric layer (solid line 410).

The incorporation of a half-lambda dielectric layer in the XBAR device 300 results in a stiffer diaphragm with higher thermal conductivity and potentially lower excitation of spurious modes compared to a conventional XBAR device. These benefits come at the cost of reducing electromechanical coupling and correspondingly lower difference between the resonance and anti-resonance frequencies.

Figure 5:
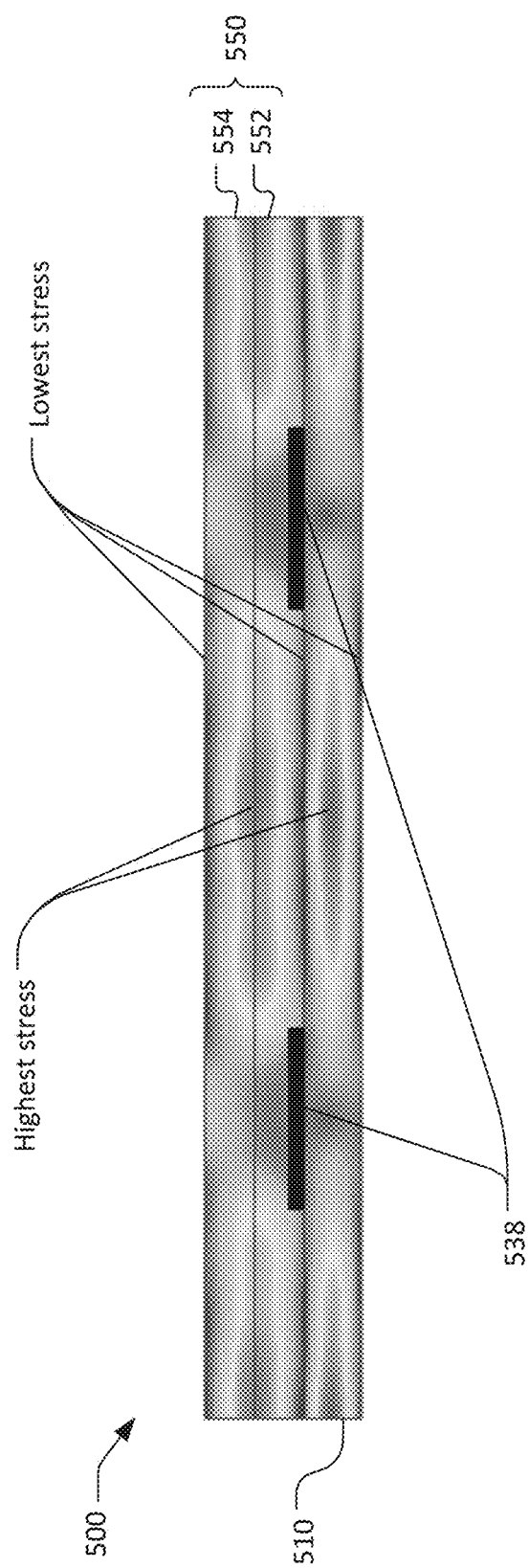
FIG. 5 is a cross-sectional view of an XBAR with a half-lambda dielectric layer with contours representing stress at the resonance frequency.

FIG. 5 is a cross-sectional view of an XBAR 500 with a half-lambda dielectric layer with contours representing the stress at the resonance frequency. The piezoelectric plate 510 is lithium niobate 400 nm thick. The IDT fingers 538 are aluminum 100 nm thick. The half-lambda dielectric layer 550 consists of a layer 552 of $Si_3N_4$ 350 nm thick and a layer 554 of AlN 350 nm thick.

The stress in the XBAR 500 at the resonance frequency is illustrative of a full-cycle standing wave between the surfaces of the device. The stress is highest near the center of the thickness of the piezoelectric plate 510 and near the center of the dielectric layer 550, corresponding to the peaks of the two half-cycles of the standing wave. The stress is lowest at the surfaces of the device and near the boundary between the piezoelectric plate 510 and near the center of the dielectric layer 550, corresponding to the zero crossings of the standing wave.

FIG. 6 is a chart 600 illustrating the use of pitch and dielectric layer thickness to tune the resonance and anti-resonance frequencies of an XBAR with a half-lambda dielectric layer. The solid line 610 is a plot of the magnitude of admittance as a function of frequency for an XBAR with pitch and mark of 4.25 µm and 1.275 µm, respectively. The piezoelectric plate is lithium niobate 400 nm thick. The IDT is aluminum 100 nm thick. The half-lambda dielectric layer consists of a layer of $Si_3N_4$ 700 nm thick. The resonance frequency is 4.513 GHz and the anti-resonance frequency is 4.749 GHz. The difference between the anti-resonance and resonance frequencies is 236 MHz, or about 5.1% of the average of the resonance and anti-resonance frequencies.

The dotted line 620 is a plot of the magnitude of admittance as a function of frequency for a similar XBAR with the same construction except the pitch and mark of the IDT fingers are 3.75 µm and 1.31 µm, respectively. The resonance frequency is 4.557 GHz and the anti-resonance frequency is 4.795 GHz. Changing the IDT pitch from 4.25 µm to 3.75 µm increases the resonance and anti-resonance frequencies by about 45 MHz. Varying the pitch over a range from 3 µm to 5 µm will provide a tuning range of about 200 MHz.

The dashed line 630 is a plot of the magnitude of admittance as a function of frequency for a similar XBAR. The pitch and mark of the IDT fingers are 4.25 µm and 1.275 µm, respectively, and the dielectric layer includes a layer of $Si_3N_4$ 700 nm thick plus a 50 nm layer of $SiO_2$. The resonance frequency is 4.400 GHz and the anti-resonance frequency is 4.626 GHz. Adding the 50 nm "tuning layer" reduces the resonance and anti-resonance frequencies by about 110 MHz.

FIG. 7 is another chart 700 illustrating the use of pitch and dielectric layer thickness to tune the resonance and anti-resonance frequencies of an XBAR with a half-lambda dielectric layer. The solid line 710 is a plot of the magnitude of admittance as a function of frequency for an XBAR with pitch and mark of 4.25 µm and 1.275 µm, respectively. The piezoelectric plate is lithium niobate 400 nm thick. The IDT is aluminum 100 nm thick. The half-lambda dielectric layer consists of a layer of $SiO_2$ 400 nm thick. The resonance frequency is 4.705 GHz and the anti-resonance frequency is 5.108 GHz. The difference between the anti-resonance and resonance frequencies is 403 MHz, or about 8.2% of the average of the resonance and anti-resonance frequencies.

The dotted line 720 is a plot of the magnitude of admittance as a function of frequency for a similar XBAR with the same construction except the pitch and mark of the IDT fingers are 3.75 µm and 1.31 µm, respectively. The resonance frequency is 4.740 GHz and the anti-resonance frequency is 5.137 GHz. Changing the IDT pitch from 4.25 µm to 3.75 µm increases the resonance and anti-resonance frequencies by about 35 MHz. Varying the pitch over a range from 3 µm to 5 µm will provide a tuning range of about 100 MHz.

The dashed line 730 is a plot of the magnitude of admittance as a function of frequency for a similar XBAR with the same construction except the pitch and mark of the IDT fingers are 4.25 µm and 1.275 µm, respectively, and the dielectric layer is of $SiO_2$ 450 nm thick. The resonance frequency is 4.512 GHz and the anti-resonance frequency is 4.905 GHz. The difference between the anti-resonance and resonance frequencies is 393 MHz, or about 8.3% of the average of the resonance and anti-resonance frequencies. Increasing the thickness of the dielectric layer by 50 nm reduces the resonance and anti-resonance frequencies by about 190 MHz without reducing electromechanical coupling.

Figure 8:
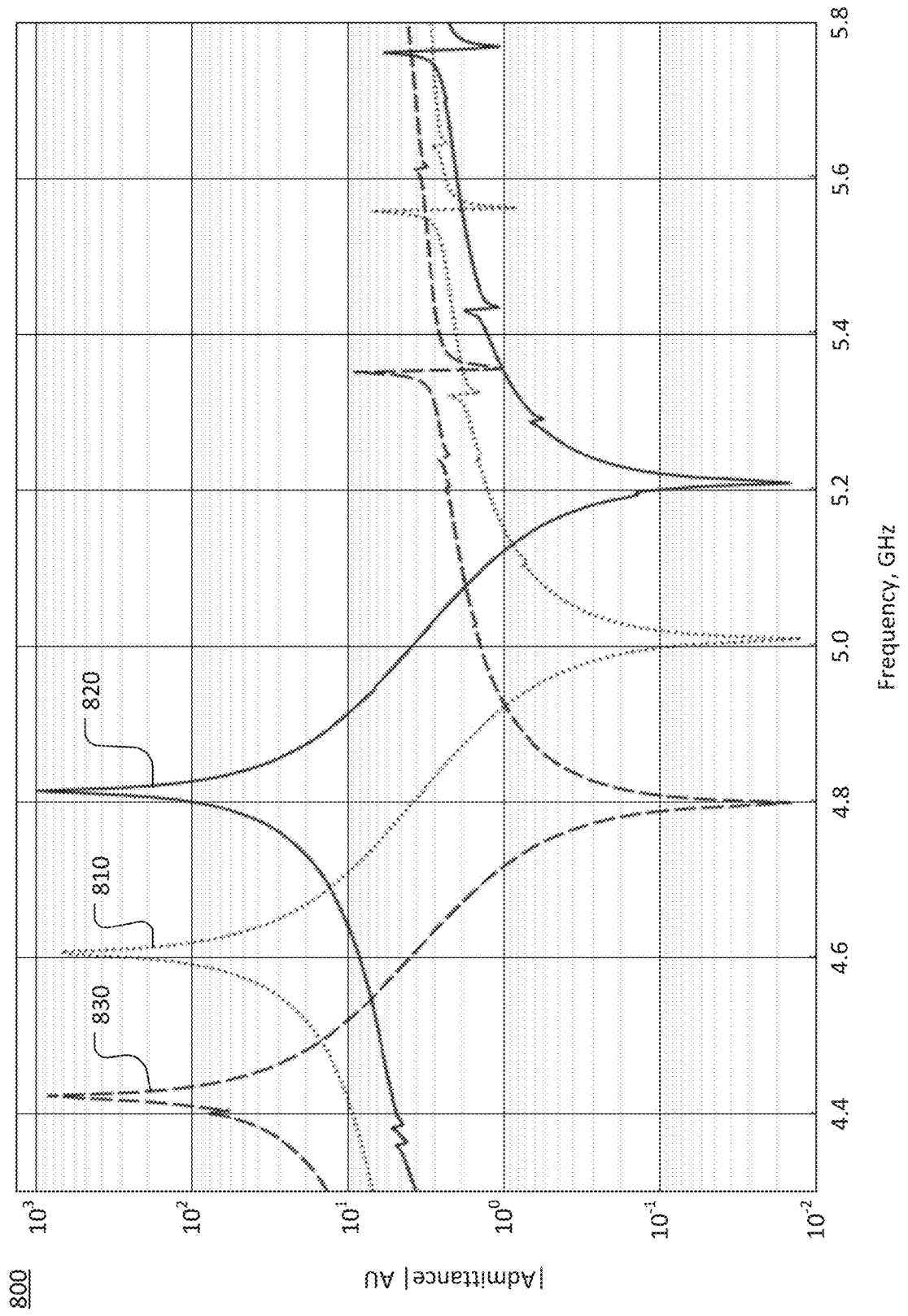
FIG. 8 is a chart comparing the admittances of three other XBARs with half-lambda $SiO_2$ layers.

FIG. 8 is another chart 800 illustrating the use of dielectric layer thickness to tune the resonance and anti-resonance frequencies of an XBAR with a half-lambda dielectric layer. The dotted line 810 is a plot of the magnitude of admittance as a function of frequency for an XBAR with pitch and mark of 4.25 μm and 1.275 respectively. The piezoelectric plate is lithium niobate 400 nm thick. The IDT is aluminum 100 nm thick. The half-lambda dielectric layer consists of a layer of $SiO_2$ 425 nm thick. This example represents the case where the thickness of the dielectric layer td equals $\lambda_{o,d}/2$.

The solid line 820 is a plot of the magnitude of admittance as a function of frequency for a similar XBAR with the same construction except the dielectric layer is $SiO_2$ 375 nm thick. In this case td=0.88($\lambda_{o,d}/2$). The dashed line 830 is a plot of the magnitude of admittance as a function of frequency for a similar XBAR with the same construction except the dielectric layer is $SiO_2$ 475 nm thick. In this case td=1.12 ($\lambda_{o,d}/2$). Varying the $SiO_2$ from 375 nm to 475 nm shifts the resonance and anti-resonance frequencies by about 400 MHz while maintaining electromechanical coupling and without introducing objectionable spurious modes.

Assuming a 400 nm thick lithium niobate piezoelectric plate, the range for td expressed in equation (1) corresponds to about 350 nm to 500 nm. This range may be expressed in terms of the thickness ts of the piezoelectric plate as follows:

$$0.875 ts \leq td \leq 1.125 ts. \quad (2)$$

It is expected that this range will apply to any thickness for the lithium niobate piezoelectric plate.

Figure 9:
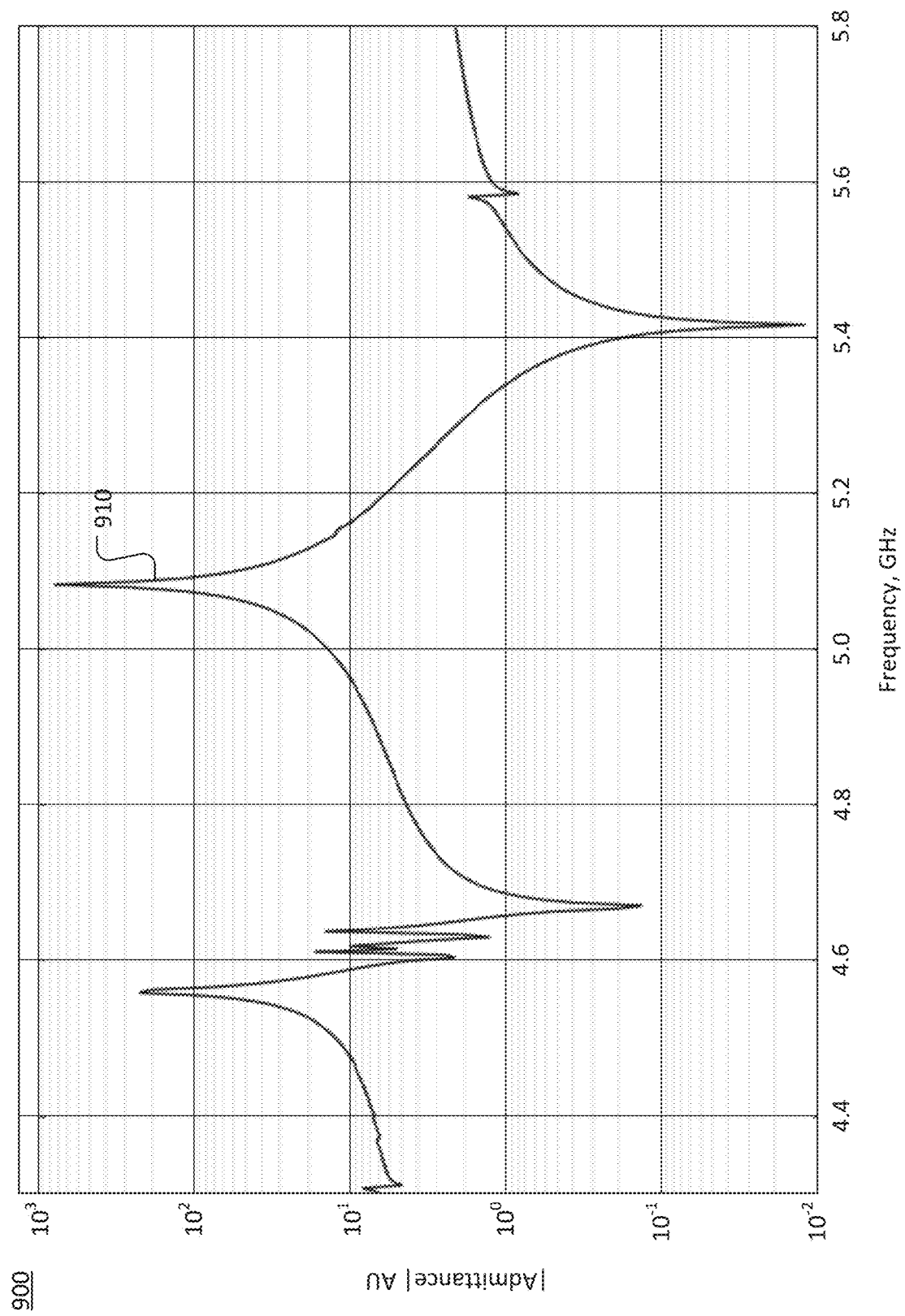
FIG. 9 is a chart of the admittance of an XBAR with an overly thin half-lambda $SiO_2$ layer.

FIG. 9 is a chart 900 illustrating the effect of an overly thin "half-lambda" dielectric layer. The solid line 910 is a plot of the magnitude of admittance as a function of frequency for an XBAR having the same construction as the devices of FIG. 8, with the SiO2 dielectric layer thickness reduced to 325 nm. In this case, td=0.76($\lambda_{o,d}/2$). Reducing the dielectric layer thickness to this extent results in reduced electromechanical coupling and very large spurious modes below the resonance frequency of the device.

Figure 10:
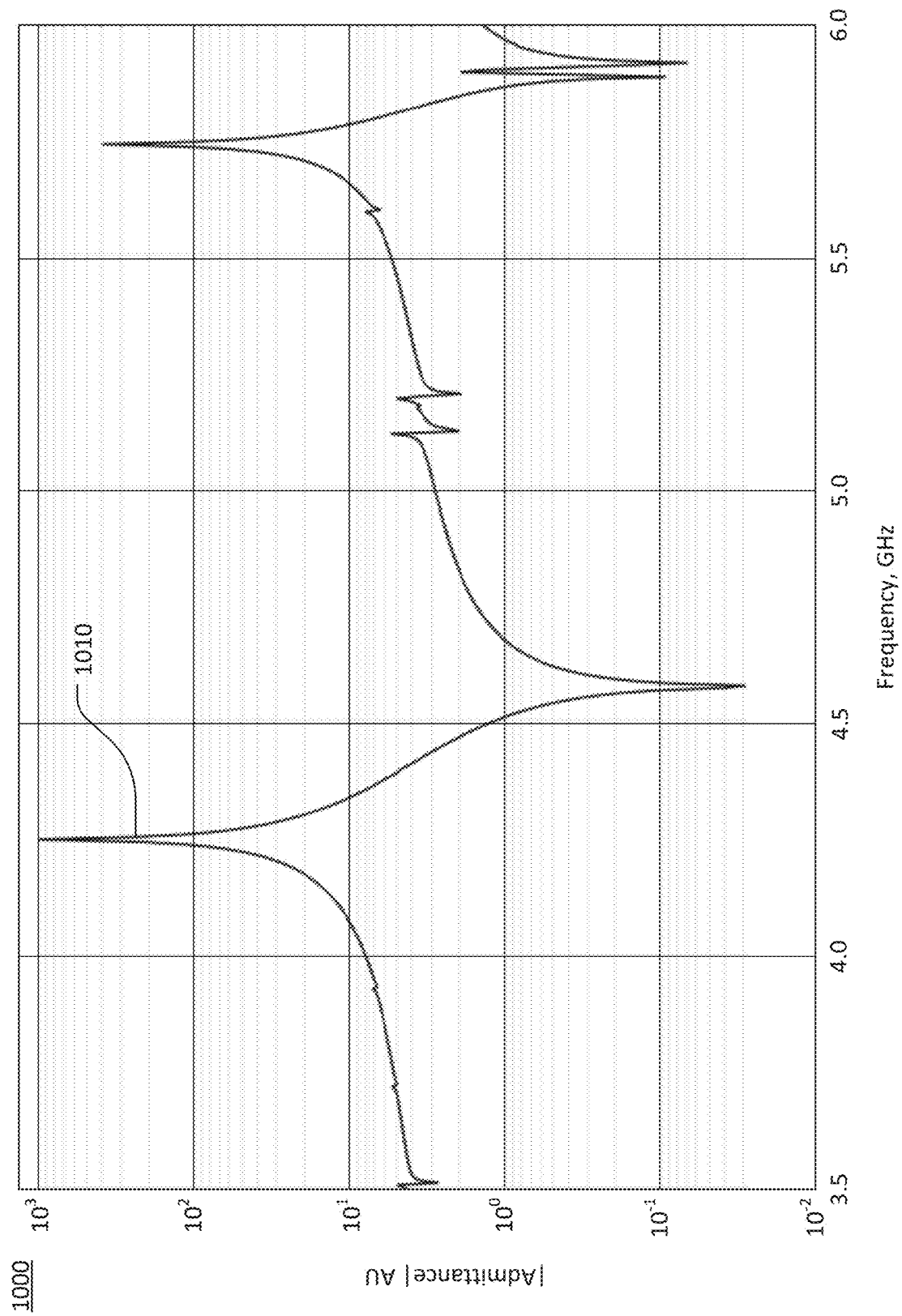
FIG. 10 is a chart of the admittance of an XBAR with an overly thick half-lambda $SiO_2$ layer.

FIG. 10 is a chart 1000 illustrating the effect of an overly thick "half-lambda" dielectric layer. The solid line 1010 is a plot of the magnitude of admittance as a function of frequency for an XBAR having the same construction as the devices of FIG. 8, with the SiO2 dielectric layer thickness increased to 525 nm. In this case, td=1.24($\lambda_{o,d}/2$). Increasing the dielectric layer thickness to this extent results in reduced electromechanical coupling and very large spurious modes above the resonance frequency of the device.

The temperature coefficient of frequency of SiO2 and the temperature coefficient of frequency of lithium niobate have similar magnitude and opposing signs. XBAR devices with an SiO2 half-lambda dielectric layer will have substantially less frequency variation with temperature than conventional XBAR devices.

Figure 11:
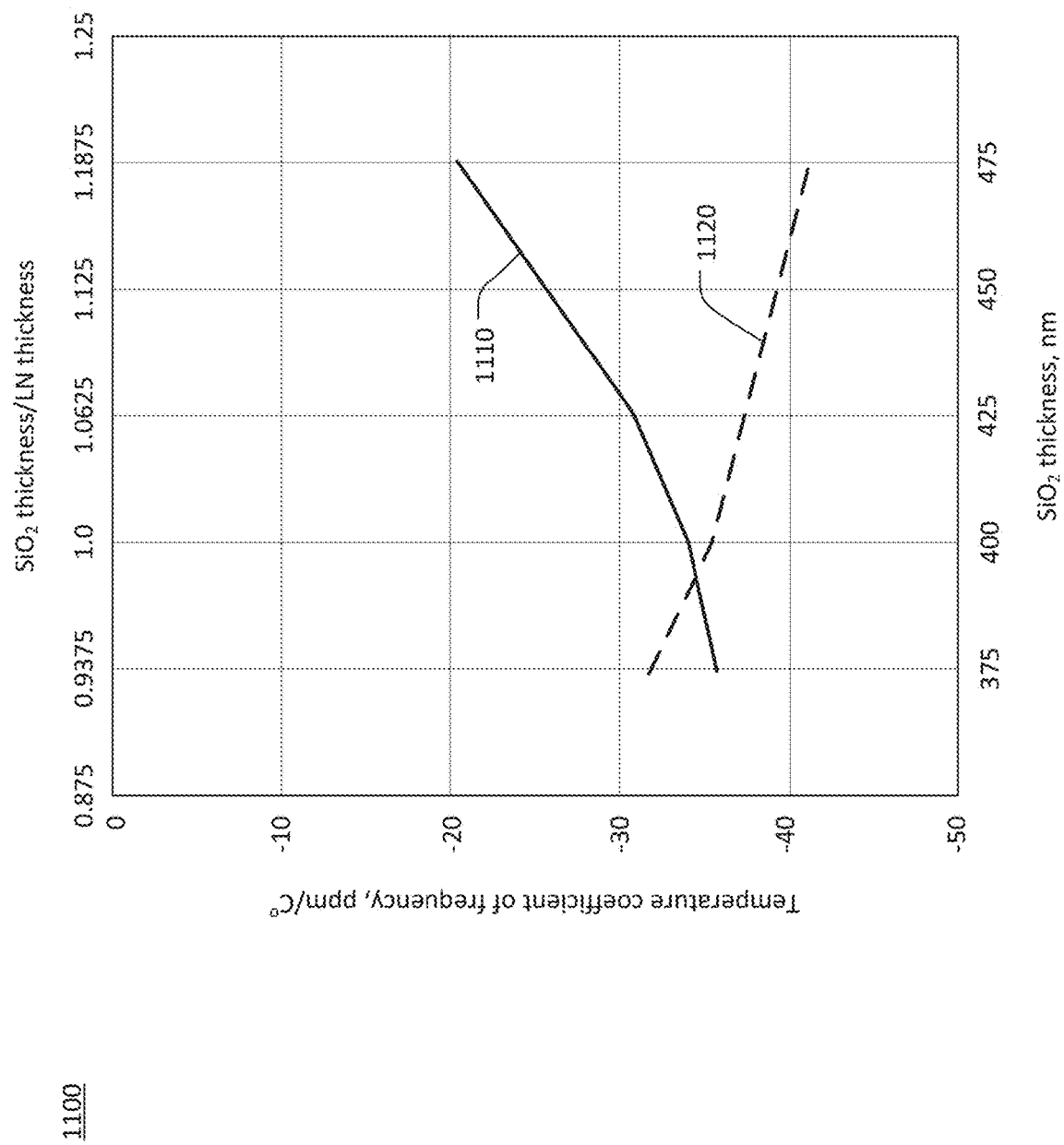
FIG. 11 is a chart of the temperature coefficient of frequency of an XBAR as a function of $SiO_2$ thickness.

FIG. 11 is a chart of the temperature coefficient of frequency of an XBAR as a function of $SiO_2$ thickness. Specifically, the solid line 1110 is a plot of temperature coefficient of the anti-resonance frequency for the XBAR devices whose admittance characteristics were previously shown in FIG. 7 and FIG. 8. The dashed line 1120 is a plot of temperature coefficient of the resonance frequency of the same devices. Simulation results show that a conventional XBAR device without a dielectric layer has a temperature coefficient of frequency around −113 ppm/C°. The presence of the SiO2 half-lambda dielectric layer reduces the magnitude of the temperature coefficient of frequency by a factor of about 3.

Figure 12:
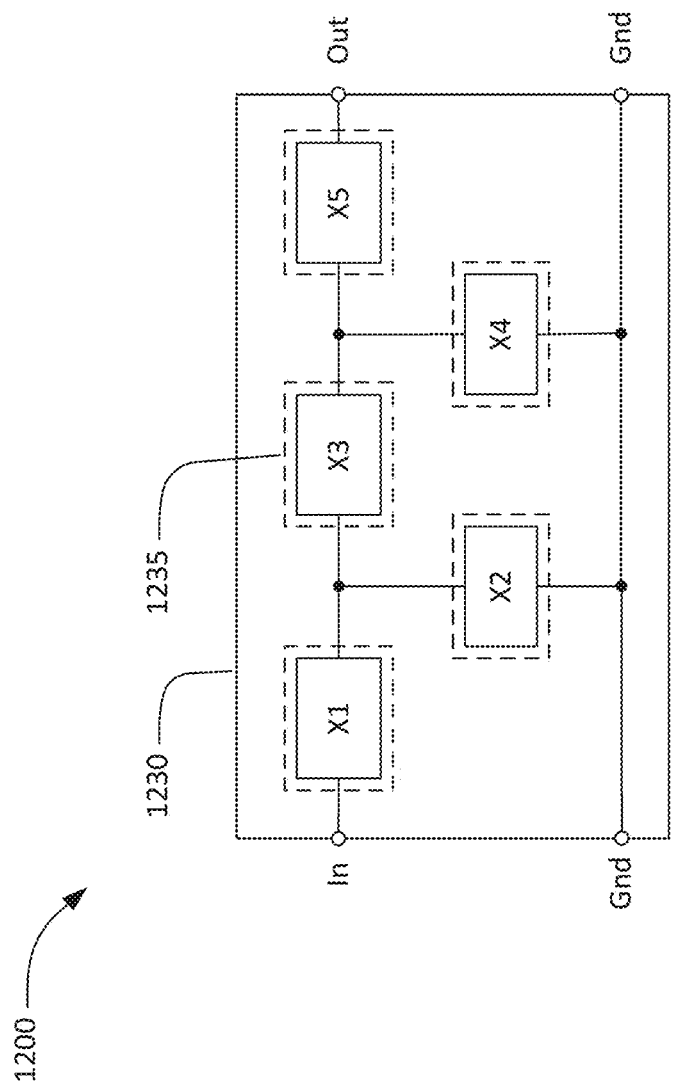
FIG. 12 is a schematic circuit diagram and layout of a filter using XBARs.

FIG. 12 is a schematic circuit diagram of a band-pass filter 1200 using five XBARs X1-X5. The filter 1200 may be, for example, a band n79 band-pass filter for use in a communication device. The filter 1200 has a conventional ladder filter architecture including three series resonators X1, X3, X5 and two shunt resonators X2, X4. The three series resonators X1, X3, X5 are connected in series between a first port and a second port. In FIG. 12, the first and second ports are labeled "In" and "Out", respectively. However, the filter 1200 is bidirectional and either port may serve as the input or output of the filter. The two shunt resonators X2, X4 are connected from nodes between the series resonators to ground. All the shunt resonators and series resonators are XBARs.

The three series resonators X1, X3, X5 and the two shunt resonators X2, X4 of the filter 1200 may be formed on a single plate 1230 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 12, the cavities are illustrated schematically as the dashed rectangles (such as the rectangle 1235). In this example, an IDT of each resonator is disposed over a respective cavity. In other filters, the IDTs of two or more resonators may be disposed over a common cavity. Resonators may also be cascaded into multiple IDTs which may be formed on multiple cavities.

Each of the resonators X1 to X5 has a resonance frequency and an anti-resonance frequency. In simplified terms, each resonator is effectively a short circuit at its resonance frequency and effectively an open circuit at its anti-resonance frequency. Each resonator X1 to X5 creates a "transmission zero", where the transmission between the in and out ports of the filter is very low. Note that the transmission at a "transmission zero" is not actually zero due to energy leakage through parasitic components and other effects. The three series resonators X1, X3, X5 create transmission zeros at their respective anti-resonance frequencies (where each resonator is effectively an open circuit). The two shunt resonators X2, X4 create transmission zeros at their respective resonance frequencies (where each resonator is effectively a short circuit). In a typical band-pass filter using acoustic resonators, the anti-resonance frequencies of the series resonators are higher than an upper edge of the passband such that the series resonators create transmission zeros above the passband. The resonance frequencies of the shunt resonators are less than a lower edge of the passband such that the shunt resonators create transmission zeros below the passband.

Referring to the admittance versus frequency data of FIG. 7 and FIG. 8, it can be seen that the frequency offset between the resonance and anti-resonance frequencies of an XBAR with a 400 nm z-cut lithium niobate piezoelectric plate and a half-lambda dielectric layer is about 400 MHz. This frequency separation is not, of itself, sufficient for band-pass filters for telecommunications bands such as n79 (4400 MHz to 5000 MHz) and n77 (3300 MHZ to 4200 MHz). U.S. Pat. No. 10,491,192 describes the use of a dielectric layer deposited over shunt resonators to reduce the resonance frequencies of the shunt resonators relative to the resonance frequencies of the series resonators. U.S. Pat. No. 10,491, 192 describes filters with very thin or no dielectric layer over series resonators and a dielectric layer thickness of about 0.25 times the piezoelectric plate thickness over shunt resonators.

A similar approach may be used to lower the resonance frequencies of shunt resonators relative to the resonance frequencies of the series resonators when the resonators are XBARs with half-lambda dielectric layers. In this case, the thickness tds of the dielectric layer over series resonators and the thickness tdp of the dielectric layer over shunt (parallel) resonators may be defined by $$0.85\lambda_{0,d} \leq 2tds \leq 2tdp < 1.15\lambda_{0,d} \quad (3)$$

Referring back to FIG. 8, the solid curve 820 is the admittance of an XBAR with a 375 nm $SiO_2$ layer over a 400 nm lithium niobate piezoelectric plate. The dashed curve 830 is the admittance of an XBAR with a 475 nm $SiO_2$ layer over a 400 nm lithium niobate piezoelectric plate. A filter, such as the filter 1200, could be fabricated using a 400 nm lithium niobate piezoelectric plate with 375 nm $SiO_2$ layer over series resonators and 475 nm SiO2 layer over shunt resonators. In this case, the frequency separation between the resonance frequency of the shunt resonators and the anti-resonance frequency of the series resonators will be about 800 MHz, which is sufficient for a band-pass filter for band n79. The frequency separation will scale proportionally with the thickness of the piezoelectric plate.

The ranges for the thickness of the $SiO_2$ layers over series and shunt resonators may be expressed in terms of the thickness ts of the lithium niobate piezoelectric plate as follows:

$$0.875ts \leq tds < tdp \leq 1.125ts, \quad (4)$$

where tds is the thickness of the $SiO_2$ layer over series resonators and tdp is the thickness of the $SiO_2$ layer over shunt (parallel) resonators.

All of the previous examples were XBARs with Z-cut lithium niobate piezoelectric plates. U.S. Pat. No. 10,780, 971 describes XBARs using rotated Y-cut lithium niobate piezoelectric plates. The rotated Y-crystal cut can provide higher coupling to the shear primary acoustic mode and thus wider separation between the resonance and anti-resonance frequencies.

The rotation of a piezoelectric plate is commonly defined using Euler angles. Euler angles are a system, introduced by Swiss mathematician Leonhard Euler, to define the orientation of a body with respect to a fixed coordinate system. The orientation is defined by three successive rotations, by angles α, β, and γ, about defined axes.

Figure 13:
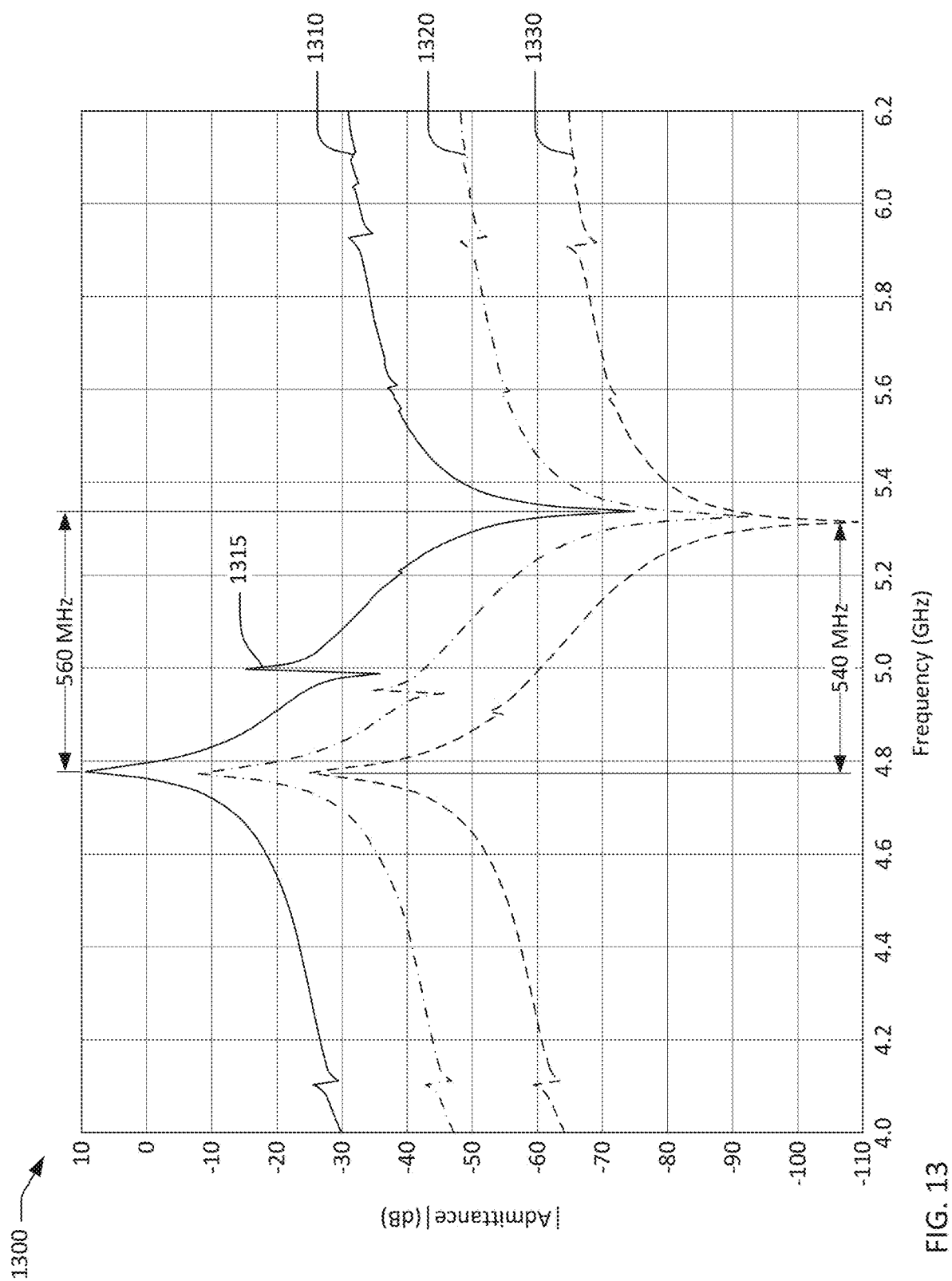
FIG. 13 is a chart comparing admittances of three XBARs with half-lambda dielectric layers and different lithium niobate cut angles.

FIG. 13 is a chart comparing the performance of three XBARs that differ only in the cut angle of the piezoelectric plate. Specifically, the solid curve 1310 is a plot of the magnitude of admittance versus frequency for an XBAR with a lithium niobate piezoelectric plate with Euler angles [0°, 38°, 0°]. For historical reasons, this plate configuration is commonly referred to as "128-degree Y-cut", where the "cut angle" is the angle between the y axis and the normal to the plate. The "cut angle" is equal to β+90°. The piezoelectric plate thickness is 380 nm. The thickness of the aluminum IDT fingers is 100 nm with 90-degree sidewall angles. The thickness of the $SiO_2$ "half-lambda" dielectric layer has thickness of 420 nm, which is roughly 0.53 lambda at the resonance frequency of the XBAR. The pitch of the IDT fingers is 4.0 microns and the mark/pitch ratio is 0.30.

The resonance frequency of the XBAR with Euler angles [0°, 38°, 0°] (solid curve 1310) is about 4780 MHz and the anti-resonance frequency is about 5340 MHz. The difference between the resonance and anti-resonance frequencies is about 560 MHz. There is a significant spurious mode 1315 at about 5.0 GHz that is not controllable by selecting the pitch and mark/pitch ratio of the IDT.

The dot-dash curve 1320 is a plot of the magnitude of admittance versus frequency for an XBAR with a lithium niobate piezoelectric plate with Euler angles [0°, 32°, 0°]. The dashed curve 1330 is a plot of the magnitude of admittance versus frequency for an XBAR with a lithium niobate piezoelectric plate with Euler angles [0°, 26°, 0°]. The three curves 1310, 1320, 1330 are offset vertically by about 17 dB for visibility. In all cases the material and structure of the XBARs is the same except for the Euler angles of the piezoelectric plates.

As the angle β (the second Euler angle) is reduced from 38° to 26°, the magnitude of the spur between the resonance and anti-resonance frequencies (e.g. spur 1315) is reduced substantially. The difference between the resonance and anti-resonance frequencies is also reduced slightly from about 560 MHz to about 540 MHz.

Figure 14:
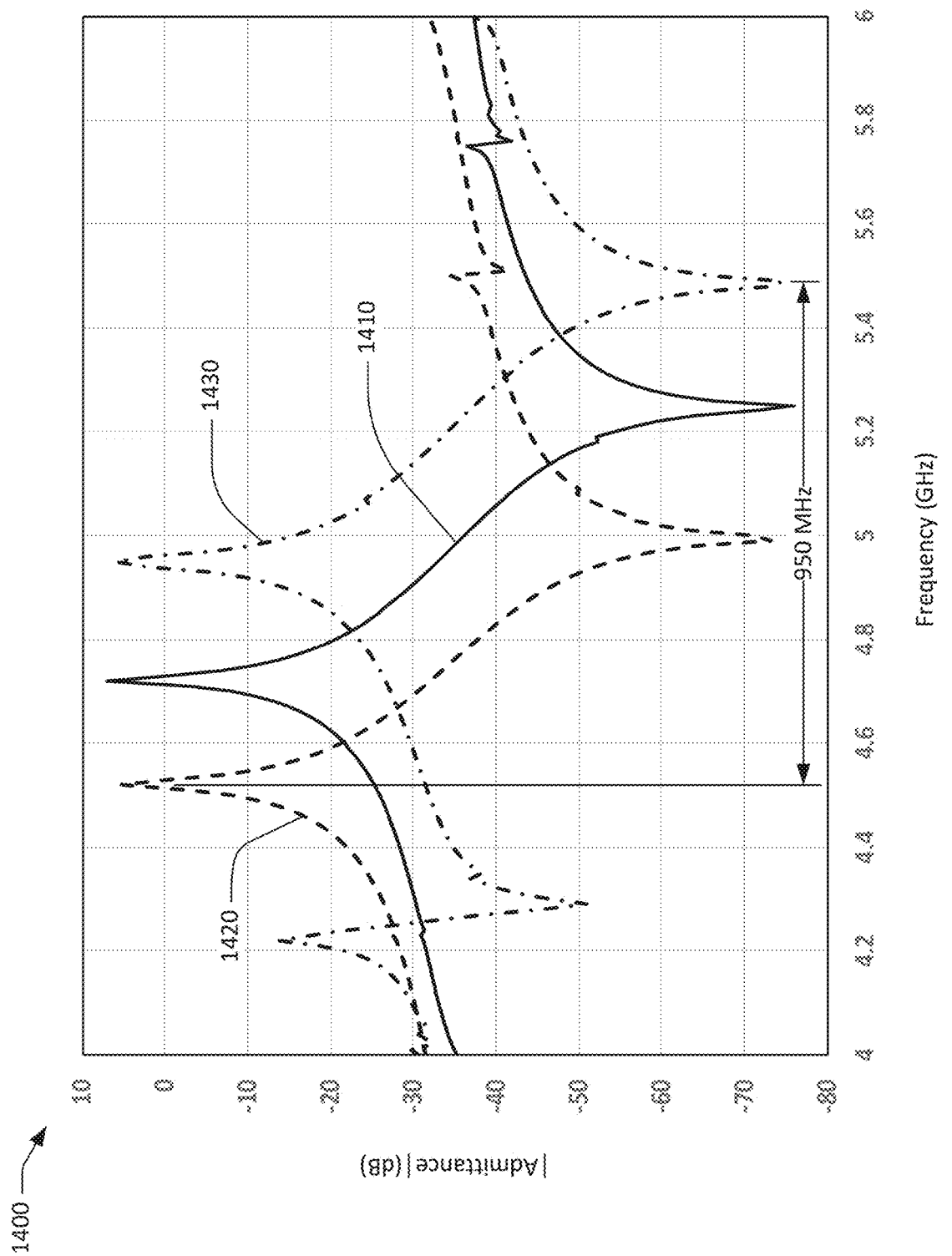
FIG. 14 is a chart comparing admittances of three XBARs with different dielectric layer thicknesses.

FIG. 14 is a chart comparing the performance of three XBARs that differ only in the thickness of the $SiO_2$ dielectric layer over the IDT. In all cases, the piezoelectric plate is lithium niobate with Euler angles [0°, 23°, 0°]. The piezoelectric plate thickness is 380 nm. The thickness of the aluminum IDT fingers is 100 nm with 90-degree sidewall angles. The pitch of the IDT fingers is 4.5 microns and the mark/pitch ratio is 0.285.

The solid line 1410 is a plot of the magnitude of admittance for an XBAR with a $SiO_2$ dielectric layer 420 nm thick. The resonance frequency is 4.73 GHz. The 420 nm thickness of the dielectric layer is about 0.53 lambda at the resonance frequency.

The dashed line 1420 is a plot of the magnitude of admittance for an XBAR with a $SiO_2$ dielectric layer 470 nm thick. The resonance frequency is 4.52 GHz. The 470 nm thickness of the dielectric layer is about 0.56 lambda at the resonance frequency.

The dot-dash line 1430 is a plot of the magnitude of admittance for an XBAR with a $SiO_2$ dielectric layer 370 nm thick. The resonance frequency is 4.94 GHz. The 370 nm thickness of the dielectric layer is about 0.49 lambda at the resonance frequency.

The spur between the resonance and anti-resonance frequencies (e.g. spur 1315 in FIG. 13) is not present in the three XBARs with Euler angles [0°, 23°, 0°]. It is expected this spur will be missing or negligible for Euler angles [0°, β, 0°], where 20°≤β≤25°.

Changing the $SiO_2$ dielectric layer thickness from 370 to 470 nm is equivalent to changing the thickness from 0.97 to 1.24 times the 380 nm thickness of the lithium niobate plate. These values do not represent the limits for the dielectric layer thickness. It is expected that $SiO_2$ dielectric layer thicknesses from 0.875 times the 380 nm thickness of the lithium niobate plate to 1.25 times the 380 nm thickness of the lithium niobate plate will provide useful resonators.

The thickness change from 0.97 to 1.24 times the thickness of the lithium niobate plate shifts the resonance and anti-resonance frequencies of the XBARs by about 420 MHz, such that the difference between the resonance frequency of the XBAR with the 470 nm dielectric layer and the anti-resonance frequency of the XBAR with the 370 nm dielectric layer is about 950 MHz. Series resonators with a dielectric layer thickness greater than or equal to 0.875 times the LN plate thickness and shunt resonators with a dielectric layer thickness less than or equal to 1.24 times the plate thickness could be connected in a ladder filter circuit as shown in FIG. 12 to provide a bandpass filter at least 900 MHz passband width.

Description of Methods

Figure 15:
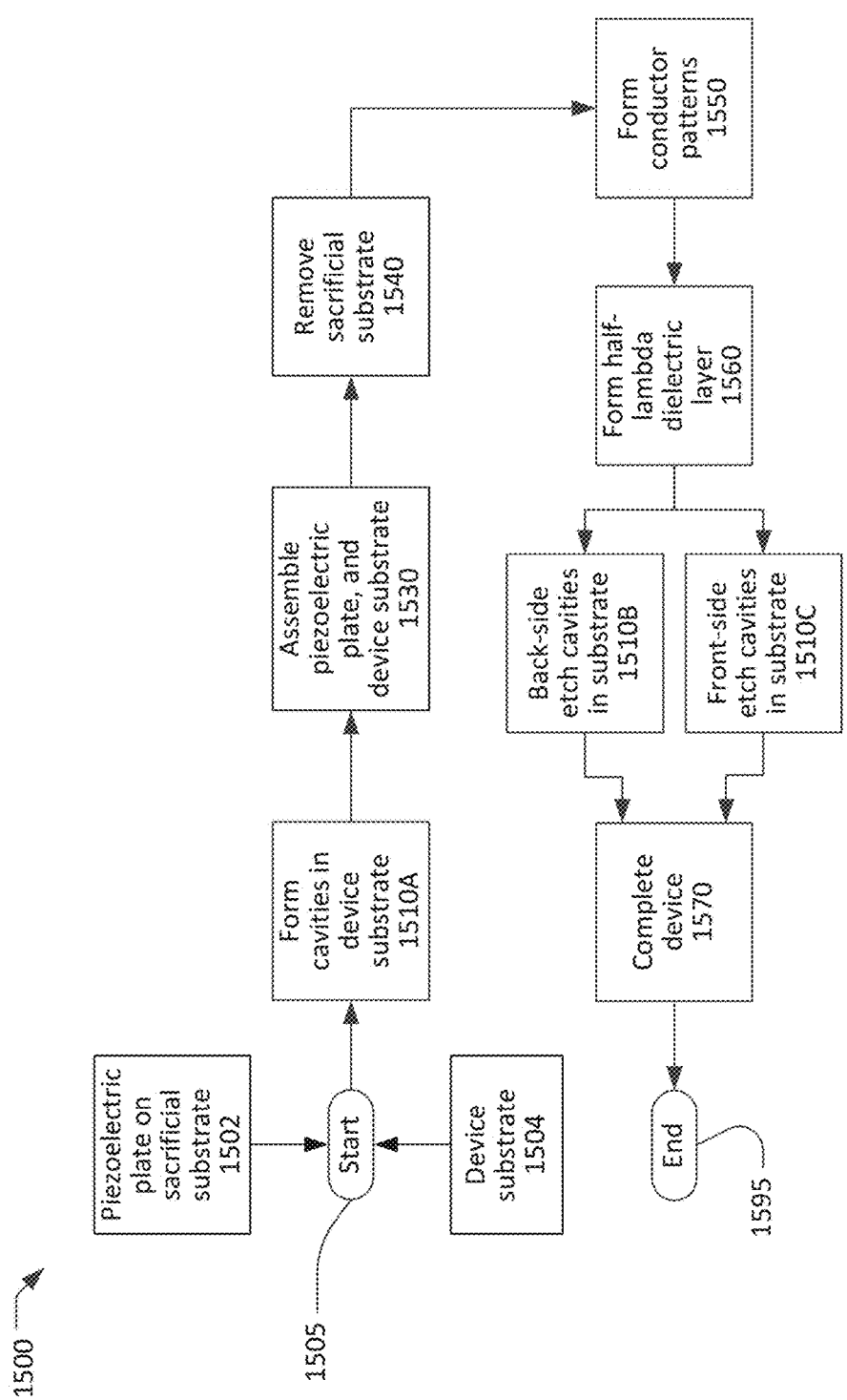
FIG. 15 is a flow chart of a process for fabricating an XBAR including a half-lambda dielectric layer.

FIG. 15 is a simplified flow chart showing a method 1500 for making an XBAR including partial Bragg reflectors or a filter incorporating such XBARs. The method 1500 starts at 1505 with a thin lithium niobate (LN) plate disposed on a sacrificial substrate 1502 and a device substrate 1504. The method 1500 ends at 1595 with a completed XBAR or filter. The flow chart of FIG. 15 includes only major process steps. Various conventional process steps (e.g. surface preparation, cleaning, inspection, baking, annealing, monitoring, testing, etc.) may be performed before, between, after, and during the steps shown in FIG. 15.

The flow chart of FIG. 15 captures three variations of the method 1500 for making an XBAR which differ in when and how cavities are formed in the substrate. The cavities may be formed at steps 1510A, 1510B, or 1510C. Only one of these steps is performed in each of the three variations of the method 1500.

Thin plates of single-crystal piezoelectric materials bonded to a non-piezoelectric substrate are commercially available. At the time of this application, both lithium niobate and lithium tantalate plates are available bonded to various substrates including silicon, quartz, and fused silica. Thin plates of other piezoelectric materials may be available now or in the future.

The thickness of the LN may be between 300 nm and 1000 nm. The LN plate is rotated Y-cut with Euler angles [0°, β, 0°], where $20°≤β≤25°$. The Euler angles may be substantially equal to [0°, 23°, 0°]. In the context, "substantially equal" means "equal within normal manufacturing tolerances." The device substrate may be silicon. When the device substrate is silicon, a layer of $SiO_2$ may be disposed between the LN plate and the substrate. The device substrate may be some other material that allows formation of deep cavities by etching or other processing.

In one variation of the method 1500, one or more cavities are formed in the device substrate at 1510A, before the LN plate is bonded to the device substrate at 1530. A separate cavity may be formed for each resonator in a filter device. The one or more cavities may be formed using conventional photolithographic and etching techniques. For example, the cavities may be formed using deep reactive ion etching (DRIE). Typically, the cavities formed at 1510A will not penetrate through the device substrate.

At 1530, the LN plate on the sacrificial substrate 1502 and the device substrate 1504 may be bonded. The LN plate on the sacrificial substrate 1502 and the device substrate 1504 may be bonded using a wafer bonding process such as direct bonding, surface-activated or plasma-activated bonding, electrostatic bonding, or some other bonding technique. The device substrate may be coated with a bonding layer, which may be $SiO_2$ or some other material, prior to the wafer bonding process.

After the LN plate on the sacrificial substrate 1502 and the device substrate 1504 are bonded, the sacrificial substrate, and any intervening layers, are removed at 1540 to expose the surface of the LN plate (the surface that previously faced the sacrificial substrate). The sacrificial substrate may be removed, for example, by material-dependent wet or dry etching or some other process. The exposed surface of the LN plate may be polished or processed in some other manner at 1540 to prepare the surface and control the thickness of the LN plate.

Conductor patterns and dielectric layers defining one or of XBAR devices are formed at 1550. Typically, a filter device will have two or more conductor layers that are sequentially deposited and patterned. The conductor layers may include bonding pads, gold or solder bumps, or other means for making connection between the device and external circuitry. The conductor layers may be, for example, aluminum, an aluminum alloy, copper, a copper alloy, molybdenum, tungsten, beryllium, gold, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layers and the piezoelectric plate. The conductor layers may include bonding pads, gold or solder bumps, or other means for making connection between the device and external circuitry.

Conductor patterns may be formed at 1550 by depositing the conductor layers over the surface of the LN plate and removing excess metal by etching through patterned photoresist. Alternatively, the conductor patterns may be formed at 1550 using a lift-off process. Photoresist may be deposited over the LN plate and patterned to define the conductor pattern. The conductor layer may be deposited in sequence over the surface of the piezoelectric plate. The photoresist may then be removed, which removes the excess material, leaving the conductor pattern.

At 1560, a half-lambda dielectric layer may be formed on the front side of the LN plate. The half-lambda dielectric layer may be deposited over the conductor patterns or may be formed only between the fingers of the IDTs. In some filter devices, a first dielectric layer may be deposited over/between the fingers of all of the IDTs, and a second dielectric may be selectively formed over a portion of the IDTs, such as over only the IDTs of shunt resonators. The first dielectric layer will typically be thicker than the second dielectric layer. The first and second dielectric layers may be the same or different materials. Either the first or second dielectric layer may be deposited first.

In a second variation of the process 1500, one or more cavities are formed in the back side of the substrate at 1510B after all of the conductor patterns and dielectric layers are formed at 1550 and 1560. A separate cavity may be formed for each resonator in a filter device. The one or more cavities may be formed using an anisotropic or orientation-dependent dry or wet etch to open holes through the back-side of the substrate to the LN plate.

In a third variation of the process 1500, one or more cavities in the form of recesses in the substrate may be formed at 1510C by etching the substrate using an etchant introduced through openings in the piezoelectric plate and half-lambda dielectric layer. A separate cavity may be formed for each resonator in a filter device. The one or more cavities formed at 1510C will not penetrate through the substrate.

In all variations of the process 1500, the filter device is completed at 1570. Actions that may occur at 1570 include depositing an encapsulation/passivation layer such as $SiO_2$ or $Si_3O_4$ over all or a portion of the device and/or forming bonding pads or solder bumps or other means for making connection between the device and external circuitry if these steps were not performed at 1550. Other actions at 1570 may include excising individual devices from a wafer containing multiple devices, other packaging steps, and testing. Another action that may occur at 1570 is to tune the resonant frequencies of the resonators within the device by adding or removing metal or dielectric material from the front side of the device. After the filter device is completed, the process ends at 1595.

A variation of the process 1500 starts with a single-crystal LN wafer at 1502 instead of a thin LN plate on a sacrificial substrate of a different material. Ions are implanted to a controlled depth beneath a surface of the LN wafer (not shown in FIG. 15). The portion of the wafer from the surface to the depth of the ion implantation is (or will become) the thin piezoelectric plate and the balance of the wafer is the sacrificial substrate. The LN wafer and device substrate are bonded at 1530 as previously described. At 1540, the LN wafer may be split at the plane of the implanted ions (for example, using thermal shock), leaving a thin plate of LN material exposed and bonded to the device substrate. The thickness of the thin plate piezoelectric material is determined in part by the energy (and thus depth) of the implanted ions. The process of ion implantation and subsequent separation of a thin plate is commonly referred to as "ion slicing". After the LN wafer is split, the exposed surface of the LN plate may be planarized, and its thickness reduced, using, for example chemo-mechanical polishing.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

What is claimed:

1. An acoustic resonator comprising:
a substrate;
a lithium niobate (LN) plate supported by the substrate and having a portion that forms a diaphragm over a cavity;
an interdigital transducer (IDT) at a surface of the LN plate and having interleaved fingers on the diaphragm; and
a half-lambda dielectric layer on the diaphragm,
wherein the LN plate comprises Euler angles that are [0°, β, 0°], where 20°≤β≤25°.

2. The acoustic resonator of claim 1, wherein the cavity extends at least partially in the substrate.

3. The acoustic resonator of claim 1, wherein the LN plate and the IDT are configured such that a radio frequency signal applied to the IDT excites a primary shear acoustic mode in the diaphragm.

4. The acoustic resonator of claim 1, wherein the diaphragm has a front surface and a back surface that oppose each other and the half-lambda dielectric layer is disposed on one of the front surface and the back surface of the diaphragm.

5. The acoustic resonator of claim 4, wherein the interleaved fingers of the IDT are disposed on the front surface of the diaphragm.

6. The acoustic resonator of claim 4, wherein the half-lambda dielectric layer is conformally disposed on the interleaved fingers of the IDT.

7. The acoustic resonator of claim 1, wherein the Euler angles of the LN plate are substantially equal to [0°, 23°, 0°].

8. The acoustic resonator of claim 1, wherein:
the half-lambda dielectric layer is $SiO_2$, and $0.875\, ts \leq td \leq 1.25\, ts$., where ts is a thickness of the LN plate and td is a thickness of the dielectric layer.

9. The acoustic resonator of claim 1, wherein the half-lambda dielectric layer is one or more of $SiO_2$, $Si_3N_4$, $Al_2O_3$, and AlN.

10. The acoustic resonator of claim 1, wherein the half-lambda dielectric layer comprises an $Si_3N_4$ layer and an AlN layer that each have a same thickness as one another.

11. The acoustic resonator of claim 1, wherein the LN plate is attached to the substrate by one or more intermediate material layers.

12. A filter device, comprising:
a plurality of bulk acoustic resonators comprising:
a substrate;
at least one lithium niobate (LN) plate supported by the substrate and having a plurality of diaphragms that are over a plurality of cavities;
a conductor pattern at a surface of the at least one LN plate, the conductor pattern including a plurality of interdigital transducers (IDTs) respective to each of the plurality of bulk acoustic resonators including a shunt resonator and a series resonator, interleaved IDT fingers of each of the plurality of IDTs being disposed on a respective diaphragm of the plurality of diaphragms;
a first dielectric layer having a thickness tds on the diaphragm of the series resonator; and
a second dielectric layer having a thickness tdp on the diaphragm of the shunt resonator,
wherein tdp is greater than tds, and
wherein the at least one LN plate comprises Euler angles that are [0°, β, 0°], where 20°≤β≤25°.

13. The filter device of claim 12, wherein the plurality of cavities each extend at least partially in the substrate.

14. The filter device of claim 12, wherein the at least one LN plate and the plurality of IDTs are each configured such that a radio frequency signal applied to the respective IDT excites a primary shear acoustic mode in the respective diaphragm.

15. The filter device of claim 12, wherein each of the plurality of diaphragms has a front surface and a back surface that oppose each other and the respective dielectric layer is disposed on one of the front surface and the back surface of the respective diaphragm.

16. The filter device of claim 15, wherein the interleaved fingers of each of the plurality of IDTs are disposed on the front surface of the respective diaphragm.

17. The filter device of claim 15, wherein each of the first and second dielectric layers is conformally disposed on the interleaved fingers of the respective IDT.

18. The filter device of claim 12, wherein the Euler angles of the at least one LN plate are substantially equal to [0°, 23°, 0°].

19. The filter device of claim 12, wherein:
the each of the first and second dielectric layers is $SiO_2$, and $0.875\ ts \leq tds \leq tdp \leq 1.25\ ts.$, where ts is a thickness of the at least one LN plate.

20. The filter device of claim 12, wherein each of the first and second dielectric layers comprises an $Si_3N_4$ layer and an AlN layer that each have a same thickness as one another.

* * * * *